US011990456B2

(12) United States Patent
Li

(10) Patent No.: US 11,990,456 B2
(45) Date of Patent: May 21, 2024

(54) COLOR TUNABLE HYBRID LED-OLED ILLUMINATION DEVICES

(71) Applicant: Arizona Board of Regents on behalf of Arizona State University, Scottsdale, AZ (US)

(72) Inventor: Jian Li, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 804 days.

(21) Appl. No.: 16/972,355

(22) PCT Filed: Jun. 4, 2019

(86) PCT No.: PCT/US2019/035331
§ 371 (c)(1),
(2) Date: Dec. 4, 2020

(87) PCT Pub. No.: WO2019/236541
PCT Pub. Date: Dec. 12, 2019

(65) Prior Publication Data
US 2021/0225825 A1 Jul. 22, 2021

Related U.S. Application Data

(60) Provisional application No. 62/680,474, filed on Jun. 4, 2018.

(51) Int. Cl.
*H01L 51/50* (2006.01)
*C09K 11/06* (2006.01)
(Continued)

(52) U.S. Cl.
CPC .......... *H01L 25/167* (2013.01); *C09K 11/06* (2013.01); *G02B 6/0051* (2013.01);
(Continued)

(58) Field of Classification Search
None
See application file for complete search history.

(56) References Cited

U.S. PATENT DOCUMENTS 6,965,197 B2  11/2005  Tyan et al.
7,535,646 B2   5/2009  Chari et al.
(Continued)

FOREIGN PATENT DOCUMENTS

CN  102313211 A     1/2012
CN  102313211 A  *  1/2021  ............ H01L 25/16

OTHER PUBLICATIONS

International Search Report and Written Opinion in related International Application No. PCT/US2019/035331, dated Aug. 29, 2019, 16 pages.

*Primary Examiner* — Gregory D Clark
(74) *Attorney, Agent, or Firm* — Fish & Richardson P.C.

(57) ABSTRACT

A hybrid LED-OLED lighting device includes a waveguide layer, a light-emitting diode (LED) array optically coupled to the waveguide layer, and an organic light-emitting diode (OLED) array. Light emitted from the LED array is provided to an edge of the waveguide layer and light emitted from the OLED array is provided to a first surface of the waveguide layer. Light emitted from the LED array and light emitted from the OLED array passes through a second surface of the waveguide layer opposite the first surface of the waveguide layer, and light emitted from the lighting device comprises the light emitted from the LED array and the light emitted from the OLED array.

23 Claims, 10 Drawing Sheets

(51) Int. Cl.
  *F21V 8/00*     (2006.01)
  *H01L 25/16*    (2023.01)
  *H10K 50/11*    (2023.01)
  *H10K 50/852*   (2023.01)
  *H10K 50/854*   (2023.01)
  *H10K 50/858*   (2023.01)
  *H10K 85/30*    (2023.01)
  *H10K 50/82*    (2023.01)
  *H10K 101/10*   (2023.01)
  *H10K 102/00*   (2023.01)

(52) U.S. Cl.
  CPC ............ *H01L 25/162* (2013.01); *H10K 50/11* (2023.02); *H10K 50/852* (2023.02); *H10K 50/854* (2023.02); *H10K 50/858* (2023.02); *H10K 85/341* (2023.02); *H10K 85/346* (2023.02); *C09K 2211/185* (2013.01); *H10K 50/82* (2023.02); *H10K 2101/10* (2023.02); *H10K 2102/331* (2023.02)

(56) References Cited

U.S. PATENT DOCUMENTS

| | | |
|---|---|---|
| 8,841,834 B2    | 9/2014 | Pickard |
| 9,535,646 B2    | 1/2017 | Saini |
| 2005/0073228 A1 | 4/2005 | Tyan et al. |
| 2014/0226361 A1 | 8/2014 | Vasylyev |
| 2016/0064620 A1 | 3/2016 | Mastin et al. |
| 2017/0012224 A1 | 1/2017 | Li et al. |
| 2017/0062531 A1 | 3/2017 | Hack |

* cited by examiner

COLOR TUNABLE HYBRID LED-OLED ILLUMINATION DEVICES

CROSS-REFERENCE TO RELATED APPLICATIONS

This application is a U.S. National Stage Application under 35 USC § 371 and claims the benefit of International Patent Application No. PCT/US2019/035331 entitled "COLOR TUNABLE HYBRID LED-OLED ILLUMINATION DEVICES" and filed on Jun. 4, 2019, which claims the benefit of U.S. Application No. 62/680,474 entitled "COLOR TUNABLE HYBRID LED-OLED ILLUMINATION DEVICES" and filed on Jun. 4, 2018, which is incorporated by reference herein in its entirety.

TECHNICAL FIELD

This invention relates to color tunable hybrid LED (light-emitting diode)-OLED (organic light-emitting diode) illumination devices with high efficiency and stability.

BACKGROUND

Efficient and stable light-emitting diodes (LEDs) and organic light-emitting diodes (OLEDs) available in some, but not all, colors. While LED and OLED based illumination devices have been developed, tunable indoor illumination with uniform planar emission and high efficiency and stability has not been achieved.

SUMMARY

In a first general aspect, a hybrid LED-OLED lighting device includes a waveguide layer, a light-emitting diode (LED) array optically coupled to the waveguide layer, and an organic light-emitting diode (OLED) array. Light emitted from the LED array is provided to an edge of the waveguide layer and light emitted from the OLED array is provided to a first surface of the waveguide layer. Light emitted from the LED array and light emitted from the OLED array passes through a second surface of the waveguide layer opposite the first surface of the waveguide layer, and light emitted from the lighting device comprises the light emitted from the LED array and the light emitted from the OLED array.

Implementations of the first general aspect may include one or more of the following features.

The light emitted from the LED array is in the blue range of the visible spectrum. The light emitted from the OLED array is in the yellow or amber range of the visible spectrum. The light emitted by the lighting device is white light (e.g., warm white light or cool white light). The light emitted by the lighting device is tunable. An intensity of the LED array and an intensity of the OLED array are independently controllable.

The edge of the waveguide layer extends between the first surface and the second surface of the waveguide layer. In some cases, the edge of the waveguide layer is approximately perpendicular to the first surface of the waveguide layer. The lighting device may include a reflective layer in direct contact with the first surface of the waveguide layer. In some cases, the lighting device includes a diffuser film in direct contact with the second surface of the waveguide layer. In certain cases, the lighting device of claim 1 includes an optical index matching adhesive between the diffuser film and the second surface of the waveguide layer.

The OLED array is coupled (e.g., optically coupled) to and configured to illuminate the first surface of the waveguide layer. In some implementations, a reflective metallic electrode of the OLED array is positioned between the waveguide layer and a substrate on which the OLED array is fabricated. In certain implementations, the waveguide layer and a light transmissive electrode of the OLED array are separated by a substrate on which the OLED array is fabricated. The OLED array may be fabricated on the waveguide layer. The LED array is typically edge-lit, and the OLED array is typically back lit.

A LED diffuser structure including the waveguide layer may further include a prism protecting film, a lenz film, a prism film, or any combination thereof. An OLED structure including the OLED array may further include an internal extraction layer, an external extraction layer, or both. In one example, the OLED structure includes an internal extraction layer, an external extraction layer, and a substrate between the internal extraction layer and the external extraction layer.

Each OLED in the OLED array typically has a cavity length selected to provide a resonance condition for emission of yellow or amber light. In some cases, each OLED in the OLED array includes an emitter represented by General Formula I:

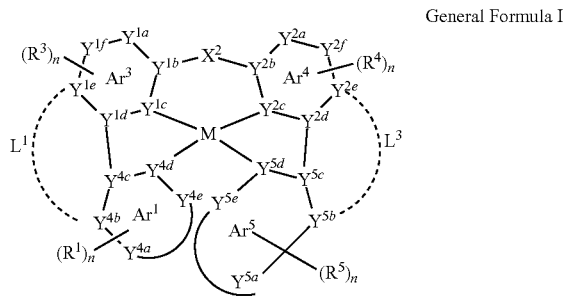

General Formula I where:

M represents Pt(II) or Pd(II);

$R^1$, $R^3$, $R^4$, and $R^5$ each independently represents hydrogen, halogen, hydroxyl, nitro, cyanide, thiol, or optionally substituted $C_1$-$C_4$ alkyl, alkoxy, amino, or aryl;

each n is independently an integer, valency permitting;

$Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, and $Y^{5e}$ each independently represents C, N, Si, O, S;

$X^2$ represents NR, PR, CRR', SiRR', CRR', SiRR', O, S, S=O, O=δ=O, Se, Se=O, or O=Se=O, where R and R' each independently represents hydrogen, halogen, hydroxyl, nitro, cyanide, thiol, or optionally substituted $C_1$-$C_4$ alkyl, alkoxy, amino, aryl, or heteroaryl;

each of $L^1$ and $L^3$ is independently present or absent, and if present, represents a substituted or unsubstituted linking atom or group, where a substituted linking atom is bonded to an alkyl, alkoxy, alkenyl, alkynyl, hydroxy, amine, amide, thiol, aryl, heteroaryl, cycloalkyl, or heterocyclyl moiety;

$Ar^3$ and $Ar^4$ each independently represents a 6-membered aryl group; and $Ar^1$ and $Ar^5$ each independently represents a 5- to 10-membered aryl, heteroaryl, fused aryl, or fused heteroaryl.

In certain cases, each OLED in the OLED array includes an emitter represented by General Formulas II-IX:

General Formula II

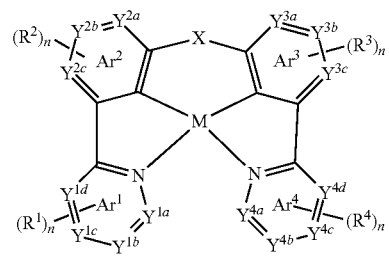

General Formula III

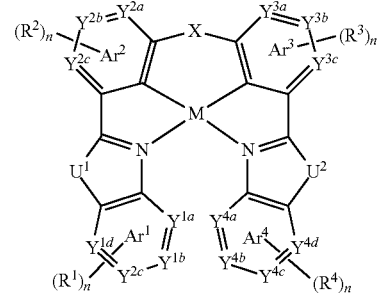

General Formula IV

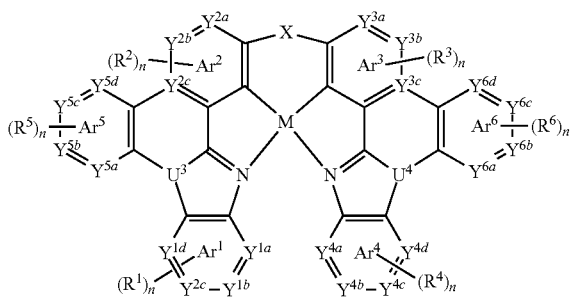

General Formula V

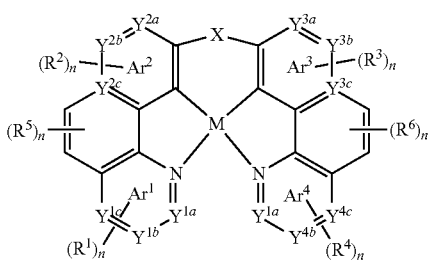

General Formula VI

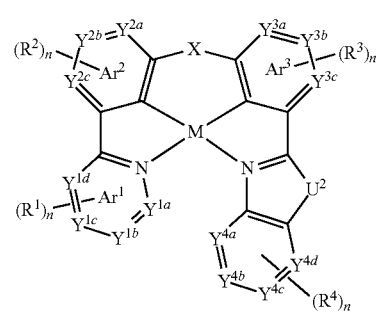

General Formula VII

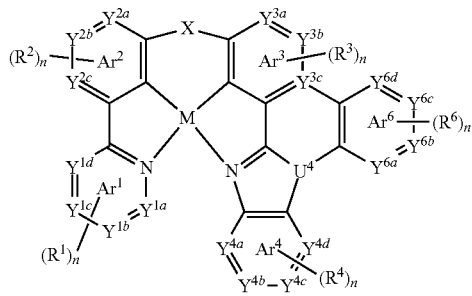

General Formula VIII

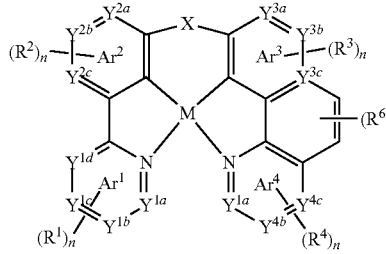

General Formula IX

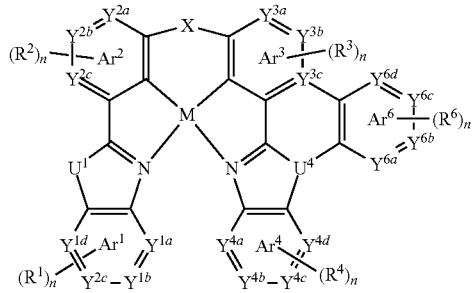

where:
M represents Pt(II) or Pd(II);
$R^1$, $R^2$, $R^3$, $R^4$, $R^5$, and $R^6$ each independently represents hydrogen, halogen, hydroxyl, nitro, nitrile, thiol, or optionally substituted $C_1$-$C_4$ alkyl, alkoxy, amino, or aryl;
each n is independently an integer, valency permitting;
$Y^{1a}$, $Y^{1b}$, $Y^{1c}$, $Y^{1d}$, $Y^{2a}$, $Y^{2b}$, $Y^{2c}$, $Y^{3a}$, $Y^{3b}$, $Y^{3c}$, $Y^{4a}$, $Y^{4b}$, $Y^{4c}$, $Y^{5a}$, $Y^{5b}$, $Y^{5c}$, $Y^{5d}$, $Y^{6a}$, $Y^{6b}$, $Y^{6c}$, and $Y^{6d}$ each independently represents C, N, or Si;
$U^1$ and $U^2$ each independently represents NR, O or S, wherein R represents hydrogen, halogen, hydroxyl, nitro, nitrile, thiol, or optionally substituted $C_1$-$C_4$ alkyl, alkoxy, amino, or aryl;
$U^3$ and $U^4$ each independently represents N or P; and
X represents O, S, NR, CRR', SiRR', PR, BR, S=O, O=S=O, Se, Se=O, or O=Se=O, where R and R' each independently represents hydrogen, halogen, hydroxyl, nitro, nitrile, thiol, or optionally substituted $C_1$-$C_4$ alkyl, alkoxy, amino, aryl, or heteroaryl.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Color tunable hybrid LED (light-emitting diode)-OLED (organic light-emitting diode) illumination devices for emitting cool white light and warm white light with high efficiency and stability are described. Electroluminescent (EL) spectra of these hybrid devices can be modified by individually controlling the driving current of the LED and OLED, thereby emitting light over a spectral range from cool white light with exclusive LED emission to warm white light with dominant OLED emission.

Figure 1A:
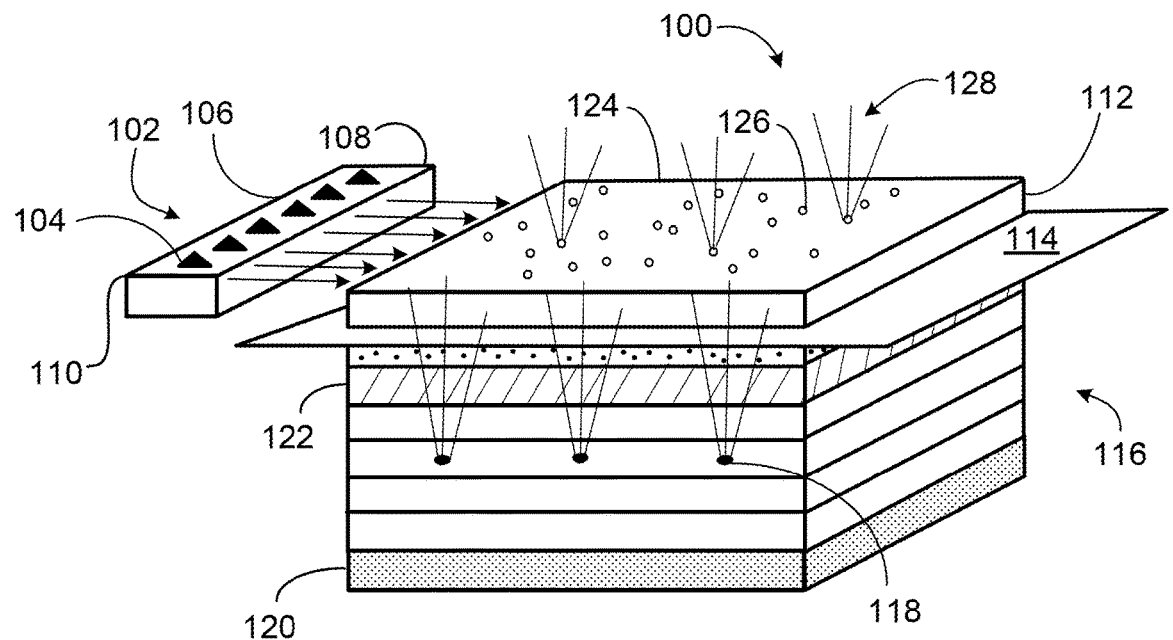
FIGS. 1A and 1B depict color tunable hybrid LED-OLED devices.

FIG. 1A depicts color tunable hybrid LED-OLED device 100. Hybrid device 100 includes LED array 102. LED array 102 includes one or more LEDs 104 arranged in optical housing 106. Each LED 104 can emit cool white light with a color temperature of over 5000 K or blue light in a range of about 440 nm to about 500 nm. LED array 102 includes electrodes 108, 110. Optical housing 106 is configured to direct light from LEDs 104 toward waveguide layer 112 in hybrid device 100 with minimum spacing between LED array 102 and waveguide layer 112 to optimize the efficiency of the LED diffuser light source depicted in FIG. 2. Waveguide layer 112 is an optical waveguide, typically made of a glass, polymer, or semiconductor material, and having a planar, strip, or fiber configuration for guiding visible radiation. As depicted, LED array 102 is edge-lit, such that light from LED array 102 is optically coupled to waveguide layer 112 in hybrid device 100. Hybrid device 100 may include two or more LED arrays 102 optically coupled to two or more sides of hybrid device 100.

In some implementations, waveguide layer 112 may serve as a substrate for OLED fabrication. In some implementations, hybrid device 100 includes a separate substrate 114 in contact with (e.g., in direct contact with) waveguide layer 112 on which OLED array 116 is fabricated. Substrate 114 is typically formed of glass or plastic. OLED array 116 includes one or more OLEDs 118. Each OLED 118 typically emits yellow or amber light exhibiting a broad emission spectrum ranging from about 480 nm to about 700 nm. OLED array 116 is back-lit and includes opaque and reflective metallic electrode 120 and light transmissive electrode 122. In some implementations, OLED array 116 includes one or more of an internal extraction layer and an external extraction layer. LED array 102 and OLED array 116 can be independently controlled.

During operation of LED array 102, light travels from LEDs 104 through waveguide layer 112 and exits hybrid device 100 through diffuser film 124. Diffuser film 124 is typically a thin film of translucent material, such as ground glass, TEFLON, holographs, opal glass, and greyed glass that diffuses or scatters light in some manner to transmit soft light. A reflective film between waveguide layer 112 and substrate 114 can inhibit light from LED array 102 from entering substrate 114. Waveguide layer 112 typically includes an optical medium and nanoparticles 126. During operation of OLED array 116, light travels from OLEDs 118 toward substrate 114, passes through waveguide layer 112 and through diffuser film 124 to exit hybrid device 100. As described in more detail with respect to FIG. 2, hybrid device 100 can include one or more of a prism film, a lenz film, and a prism protective film on diffuser film 124. Nanoparticles 126 in waveguide layer 112 facilitate scattering of light 128 in a selected visible spectrum. When LED array 102 emits blue light and OLED array 116 emits amber or yellow light, hybrid device 100 emits tunable white light.

Figure 1B:
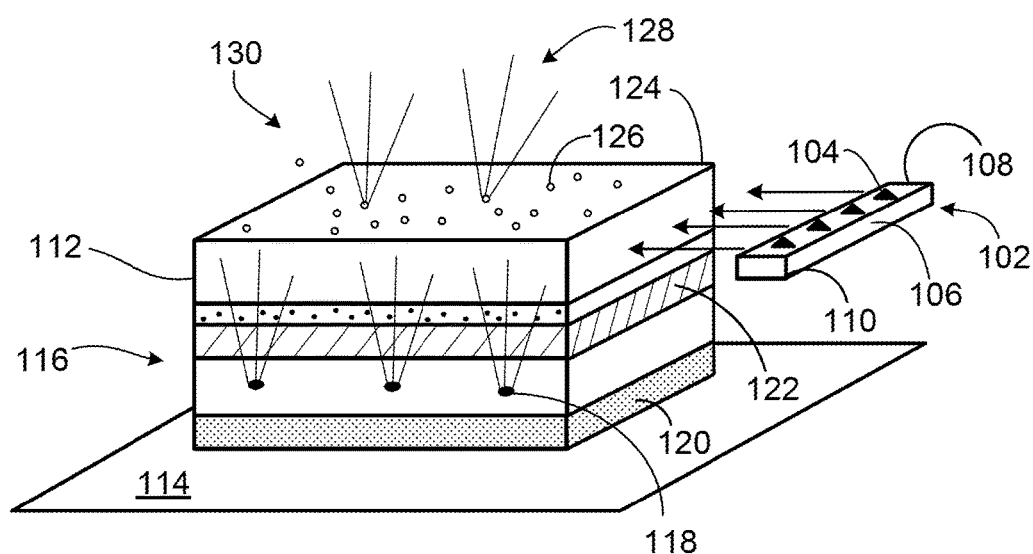

FIG. 1B depicts color tunable hybrid LED-OLED device 130. Hybrid device 130 includes LED array 102. LED array 102 includes one or more LEDs 104 arranged in optical housing 106. Each LED 104 can emit cool white light with a color temperature of over 5000 K or blue light in a range of about 440 nm to about 500 nm. LED array 102 includes electrodes 108, 110. Optical housing 106 is configured to direct light from LEDs 104 toward waveguide layer 112 in hybrid device 130. As depicted, LED array 102 is edge-lit, such that light from LED array 102 is optically coupled to waveguide layer 112 in hybrid device 130.

Hybrid device 130 may include two or more LED arrays 102 optically coupled to two or more sides of hybrid device 130. OLED array 116, positioned between waveguide layer 112 and substrate 114, includes one or more OLEDs 118. Substrate 114 is typically formed of glass or plastic. Each OLED 118 typically emits yellow or amber light. OLED array 116 is back-lit and includes opaque and reflective metallic electrode 120 and light transmissive electrode 122. As described in more detail with respect to FIG. 3, OLED array 116 can include one or more of an internal extraction layer and an external extraction layer to enhance outcoupling of light from OLED array 116. LED array 102 and OLED array 116 can be independently controlled.

During operation of LED array 102, light travels from LEDs 104 through waveguide layer 112 and exits hybrid device 130 through diffuser film 124. Waveguide layer 112 typically includes an optical medium and nanoparticles 126. During operation of OLED array 116, light travels from OLEDs 118 through waveguide layer 112 and through diffuser film 124 to exit hybrid device 130. Thus, light from OLED array 116 exits hybrid device 130 without losses associated with passing through substrate 114. As described in more detail with respect to FIG. 3, OLED array 116 can include one or more of an internal extraction layer and an external extraction layer to enhance outcoupling of light from OLED array 116. Nanoparticles 126 in waveguide layer 112 facilitate diffusion of light 128 in a selected visible spectrum. When LED array 102 emits blue light and OLED array 116 emits amber or yellow light, hybrid device 130 emits tunable white light.

LED power efficiency be increased by selecting an efficient LED light source, reducing or minimizing the air gap between LEDs 104 and waveguide layer 112, reducing or minimizing trapping of light inside substrate 114, reducing or minimizing light scattering from substrate 114 (e.g., by including an internal extraction layer), matching optical indices between layers of hybrid devices 100, 130 in direct contact (e.g., waveguide layer 112 and diffuser film 124), or any combination thereof. Matching of optical indices can be achieved by providing an optical index matching glue or adhesive between layers in direct contact. Suitable optical index matching adhesives include polysilanes or other appropriate transparent viscous polymers having a refractive index between about 1.4 and about 1.7. Examples of suitable optical index matching adhesives include Optical Couplant (Matching Gel) (available from SYOPTEK INTERNATIONAL LIMITED), optical gel from Norland and Index Matching Gel (available from Corning Incorporated).

Figure 2:
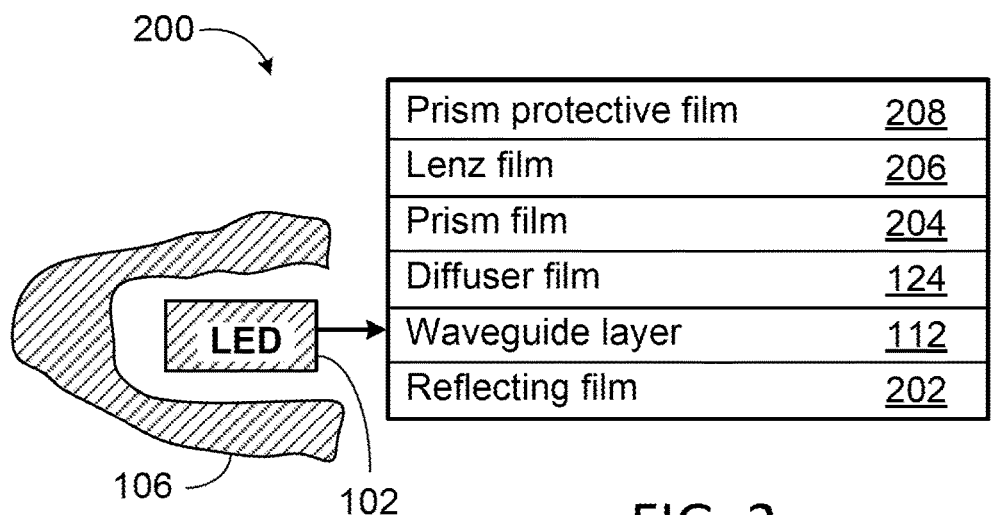
FIG. 2 depicts a schematic design of an edge-lit LED diffuser structure.

FIG. 2 depicts LED diffuser structure 200 including edge-lit LED array 102 in optical housing 106 of hybrid devices 100, 130, and optically coupled to waveguide layer 112. As depicted in FIGS. 1A and 1B, LED array 102 is optically coupled to waveguide layer 112. Reflective film 202 may be in direct contact with a first surface of waveguide layer 112. The reflectivity of reflective film 202 may be selected to achieve a desired amount of internal reflection of light from the LED and also allow maximum transmittance of amber OLED emission, such that light from LED array 102 is inhibited from traveling toward the OLED array. Diffuser film 124 may be in direct contact with waveguide layer 112. Hybrid devices 100, 130 may include one or more of prism film 204, lenz film 206, and prism protective film 208 on diffuser film. Prism film 204 is typically a polymeric film (e.g., polyester) having fine prism structures that condense light from a light source. Prism protective film 208 is typically a transparent thin film which can protect prism film 204 from physical damage. In one example, prism film 204 is between and in direct contact with diffuser film 124 and lenz film 206 is in direct contact with prism film 204 and prism protective film 208. Prism protective film 208 may form an outer layer of hybrid device 100, 130.

Figure 3:
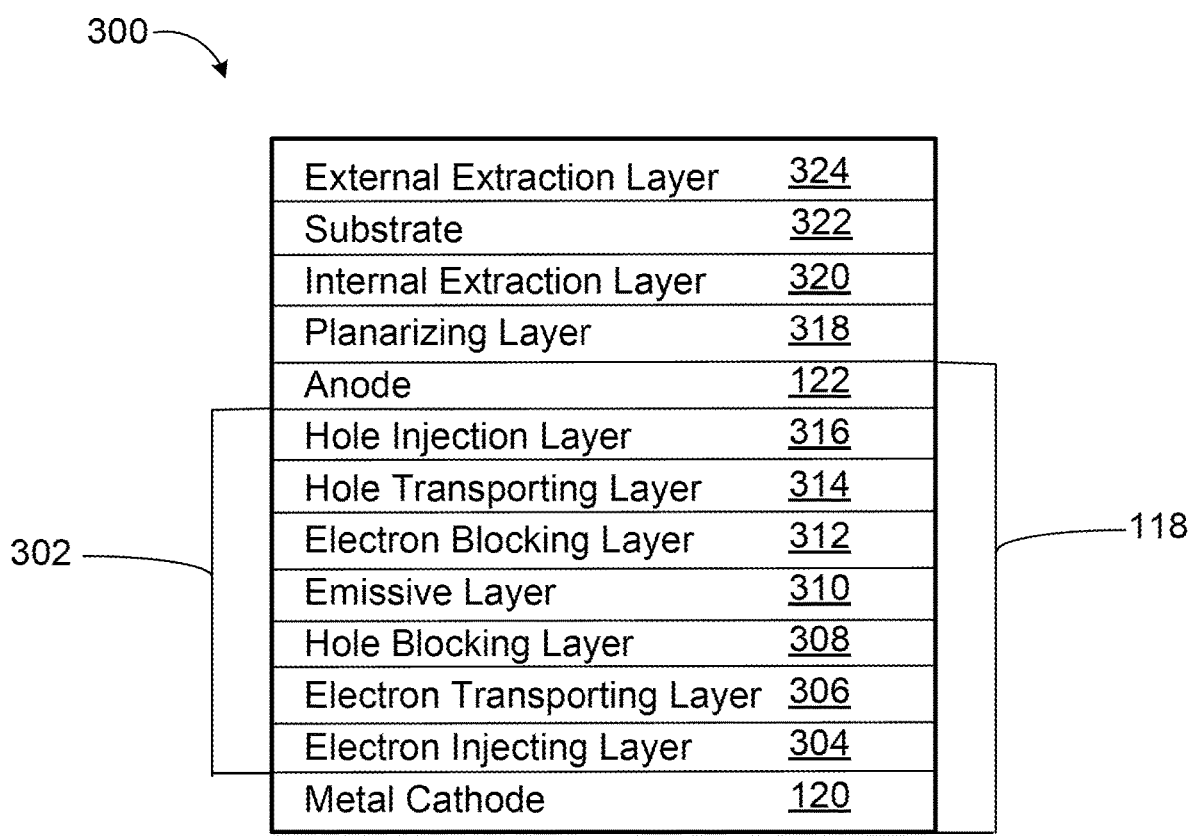
FIG. 3 depicts a schematic design of an OLED structure.

FIG. 3 depicts OLED structure 300 including OLED 118 of hybrid devices 100, 130. OLED 118 includes reflective electrode (metal cathode) 120, light transmissive electrode (anode) 122. Reflective electrode 120 typically includes Al, Ag, Au, or an alloy thereof. A typical thickness of reflective electrode 120 is between about 20 nm and about 300 nm. Light transmissive electrode 122 typically includes indium tin oxide (ITO), zinc tin oxide (ZTO), tin oxide ($SnO_x$), indium oxide ($InO_x$), molybdenum oxide ($MoO_x$), carbon nanotubes, or a combination thereof. A typical thickness of light transmissive electrode 122 is between about 10 nm and about 100 nm. Between reflective electrode 120 and light transmissive electrode 122, OLED 118 has electroluminescent layer 302 that typically includes electron injecting layer 304, electron transporting layer 306, hole blocking layer 308, emissive layer 310, electron blocking layer 312, hole transporting layer 314, and hole injecting layer 316 between reflective electrode 120 and light transmissive electrode 122. Emissive layer 318 is a yellow or amber organic emissive layer, and can include a phosphorescent excimer with the emission wavelength covering the range of about 480 nm to about 700 nm, or green-emitting and red-emitting phosphorescent emitters with overall emission wavelength covering the range of about 480 nm to about 700 nm. Electroluminescent layer 300 can include a host material selected from aryl amines and aryl-substituted carbazole compounds, aryl substituted oxadiazoles, aryl-substituted triazoles, aryl substituted phenanthrolines and metal quinoxolates, and at least one phosphorescent emitter material dispersed in the host material and selected from phosphorescent dyes including derivatives of cyclometalated metal complexes. Planarizing layer 318 may be in direct contact with light transmissive electrode 122. Planarizing layer 318 is typically a transparent film made of organic or inorganic materials and serves to reduce surface roughness of internal extraction layer 320.

Internal extraction layer 320 may be in direct contact with planarizing layer 318. Internal extraction layer 320 is typically a thin film that includes an optical medium and nanoparticles that can scatter incident light in all angles. Overall, the surface roughness of planarizing layer 318 and internal extraction layer 320 is typically less than about 10 nm or less than about 5 nm. Substrate 322 may be between and in direct contact with internal extraction layer 320 and external extraction layer 324. External extraction layer 324 is an external polymeric film attached to the surface of substrate 322 which facilitates extraction of photons trapped inside substrate 322.

OLED 118 includes a microcavity having a selected cavity length defined over substrate 322. The selected cavity length of OLED 118 is tuned to provide a resonance condition for emission of yellow or amber light through light transmissive electrode 122. The light extraction efficiency of OLED 118 can be tuned by adjusting the spacing between reflective electrode 120 and light transmissive electrode 122, and the selected cavity length can modified by adjusting a thickness of light transmissive electrode 122, a thickness of electroluminescent layer 302, or both.

Figure 4:
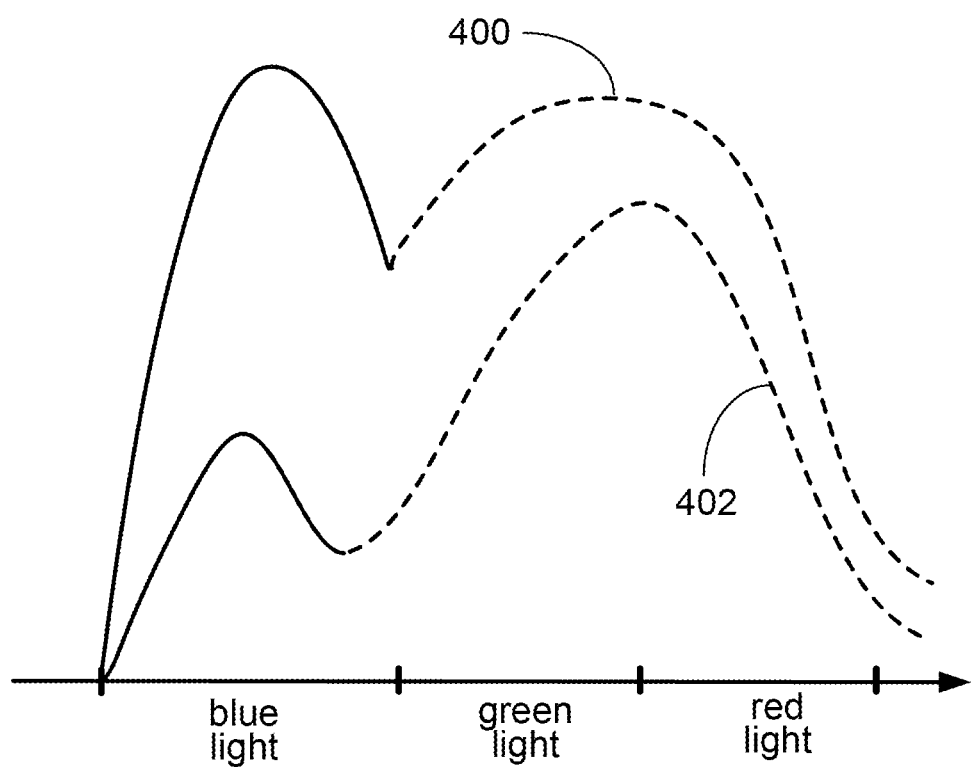
FIG. 4 illustrates cool and warm white emission spectra generated by color tunable hybrid LED-OLED device.

FIG. 4 illustrates cool and warm white emission spectra generated by hybrid LED-OLED devices, such as those depicted in FIGS. 1A and 1B. Cool emission spectrum 400 can be obtained with high LED driving currents. Warm emission spectrum 402 can be obtained with low LED driving currents.

Examples of phosphorescent excimers with yellow and amber emission (e.g., having a wavelength in a range of or covering the range of about 480 nm to about 700 nm) suitable for emissive layer 308 include complexes represented by General Formula I.

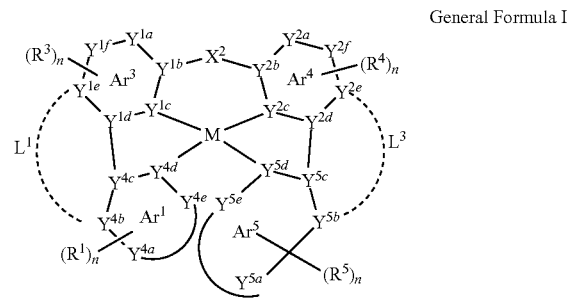

General Formula I

In General Formula I:

M represents Pt(II) or Pd(II);

$R^1$, $R^3$, $R^4$, and $R^5$ each independently represents hydrogen, halogen, hydroxyl, nitro, cyanide, thiol, or optionally substituted $C_1$-$C_4$ alkyl, alkoxy, amino, or aryl;

each n is independently an integer, valency permitting;

$Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, and $Y^{5e}$ each independently represents C, N, Si, O, S;

$X^2$ represents NR, PR, CRR', SiRR', CRR', SiRR', O, S, S=O, O=S=O, Se, Se=O, or O=Se=O, where R and R' each independently represents hydrogen, halogen, hydroxyl, nitro, cyanide, thiol, or optionally substituted $C_1$-$C_4$ alkyl, alkoxy, amino, aryl, or heteroaryl;

each of $L^1$ and $L^3$ is independently present or absent, and if present, represents a substituted or unsubstituted linking atom or group, where a substituted linking atom is bonded to an alkyl, alkoxy, alkenyl, alkynyl, hydroxy, amine, amide, thiol, aryl, heteroaryl, cycloalkyl, or heterocyclyl moiety;

Ar³ and Ar⁴ each independently represents a 6-membered aryl group; and

Ar¹ and Ar⁵ each independently represents a 5- to 10-membered aryl, heteroaryl, fused aryl, or fused heteroaryl.

Examples of complexes represented by General Formula 1 are shown below.

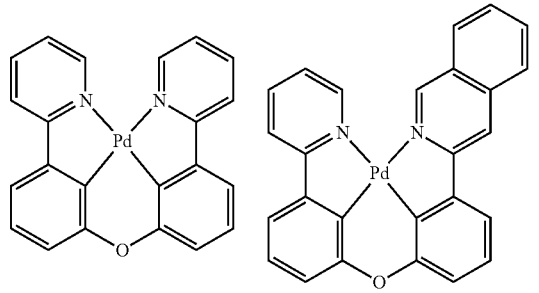

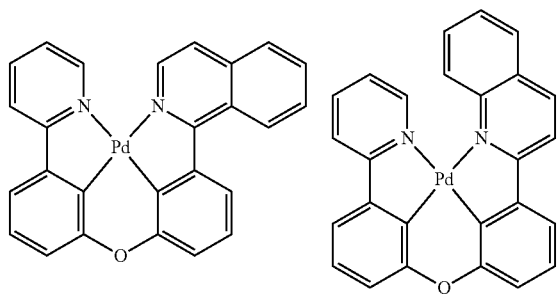

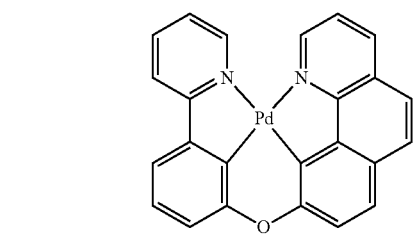

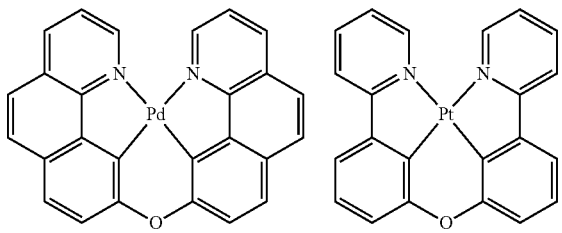

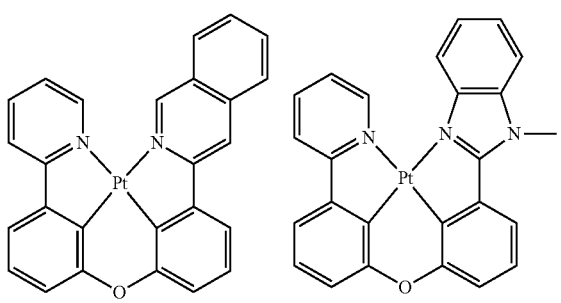

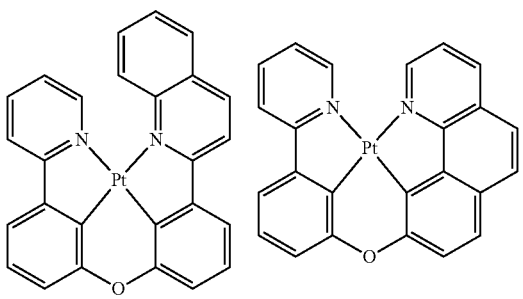

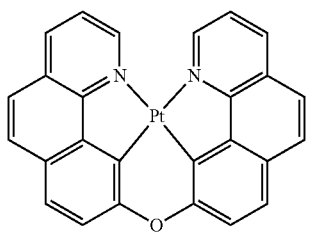

Suitable square planar tetradentate platinum and palladium complexes also include complexes represented by General Formulas II-IX.

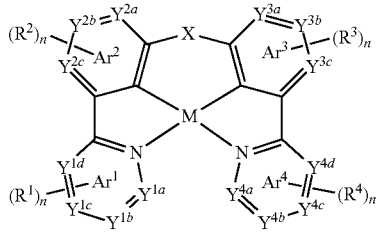

General Formula II

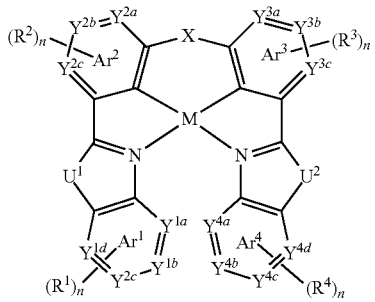

General Formula III

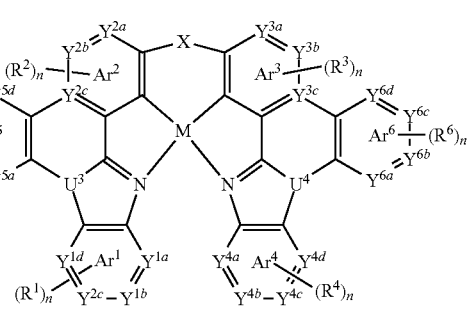

General Formula IV

-continued

General Formula V

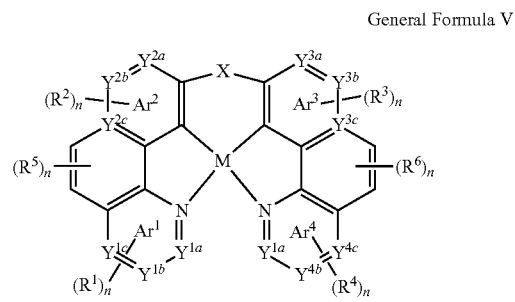

General Formula VI

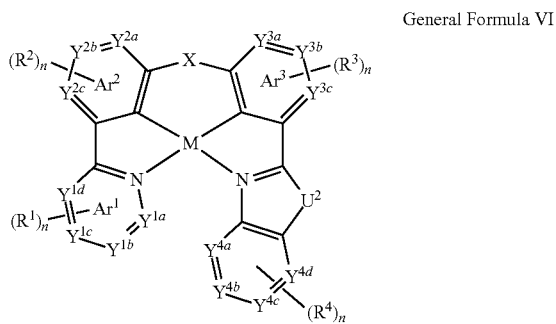

General Formula VII

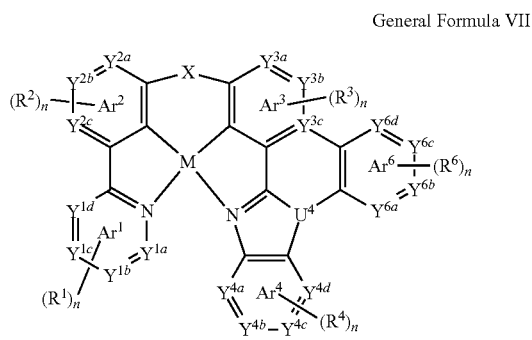

General Formula VIII

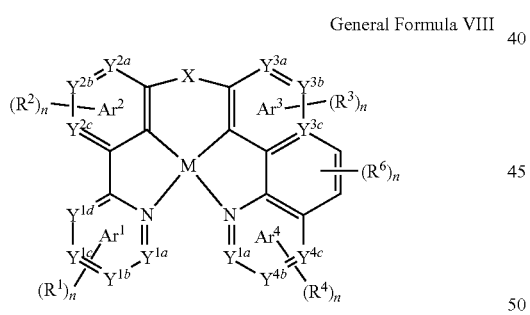

General Formula IX

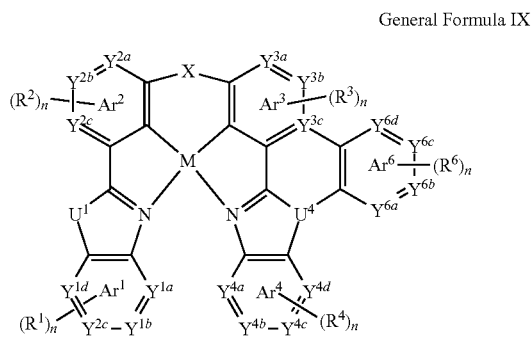

In General Formulas II-IX:

M represents Pt(II) or Pd(II);

$R^1$, $R^2$, $R^3$, $R^4$, $R^5$, and $R^6$ each independently represents hydrogen, halogen, hydroxyl, nitro, nitrile, thiol, or optionally substituted $C_1$-$C_4$ alkyl, alkoxy, amino, or aryl;

each n is independently an integer, valency permitting;

$Y^{1a}$, $Y^{1b}$, $Y^{1c}$, $Y^{1d}$, $Y^{2a}$, $Y^{2b}$, $Y^{2c}$, $Y^{3a}$, $Y^{3b}$, $Y^{3c}$, $Y^{4a}$, $Y^{4b}$, $Y^{4c}$, $Y^{5a}$, $Y^{5b}$, $Y^{5c}$, $Y^{5d}$, $Y^{6a}$, $Y^{6b}$, $Y^{6c}$, and $Y^{6d}$ each independently represents C, N, or Si;

$U^1$ and $U^2$ each independently represents NR, O or S, wherein R represents hydrogen, halogen, hydroxyl, nitro, nitrile, thiol, or optionally substituted $C_1$-$C_4$ alkyl, alkoxy, amino, or aryl;

$U^3$ and $U^4$ each independently represents N or P; and

X represents O, S, NR, CRR', SiRR', PR, BR, S=O, O=S=O, Se, Se=O, or O=Se=O, where R and R' each independently represents hydrogen, halogen, hydroxyl, nitro, nitrile, thiol, or optionally substituted $C_1$-$C_4$ alkyl, alkoxy, amino, aryl, or heteroaryl.

Examples of complexes of Formula II-IX are shown below.

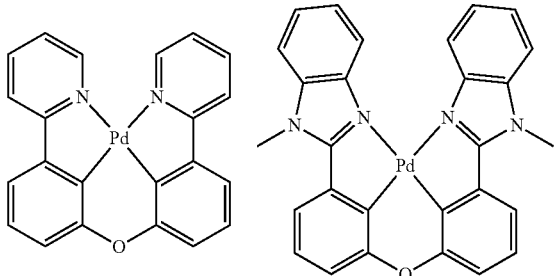

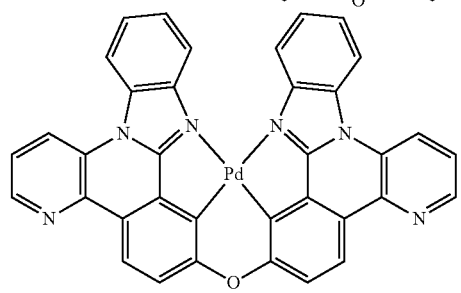

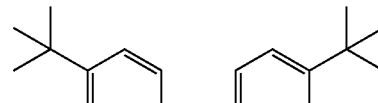

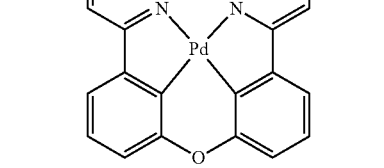

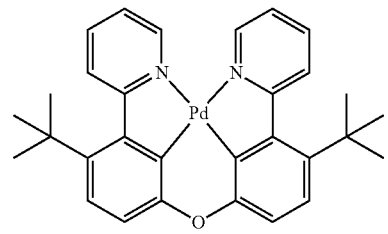

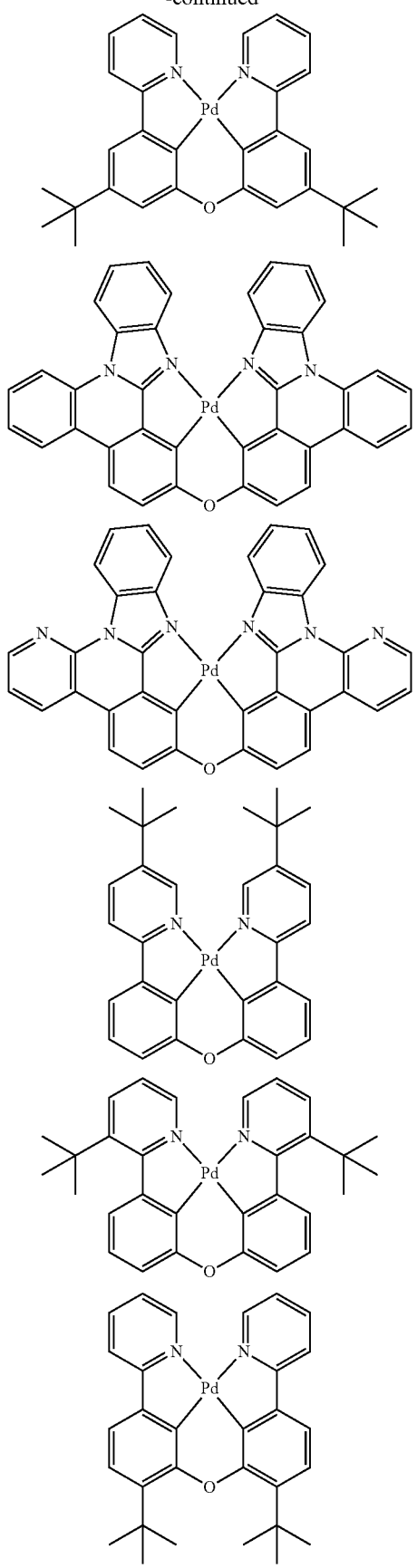
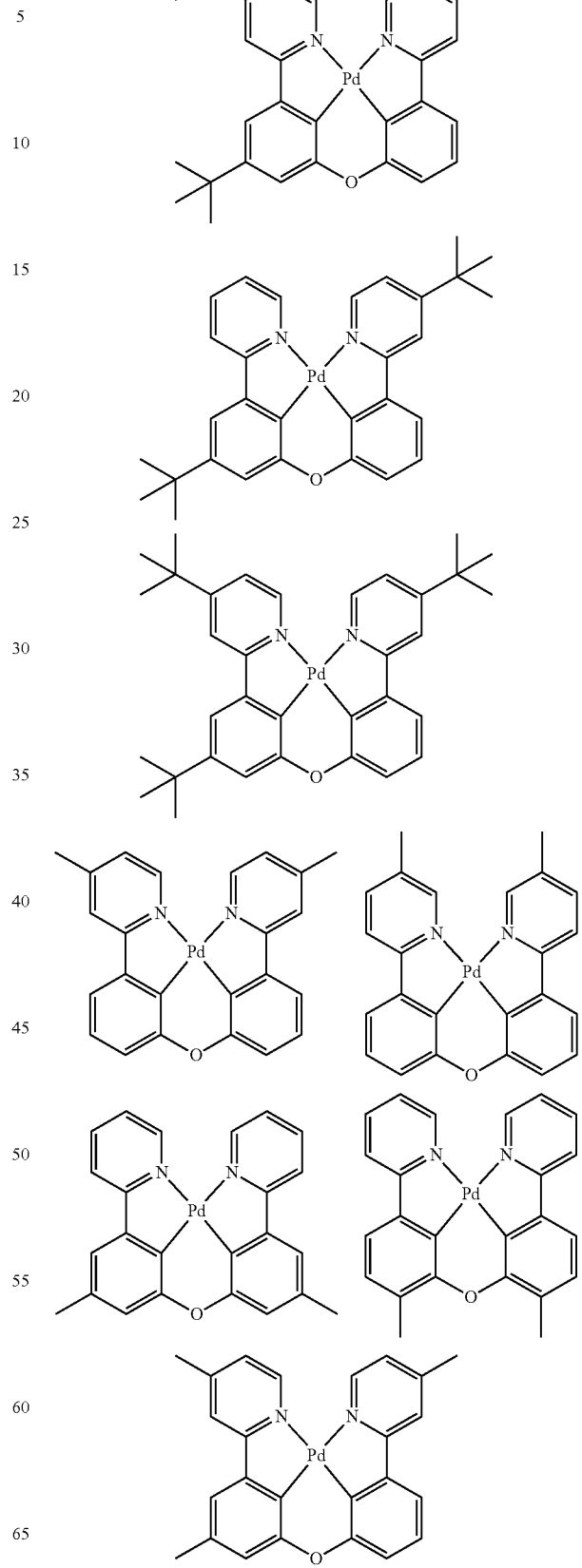

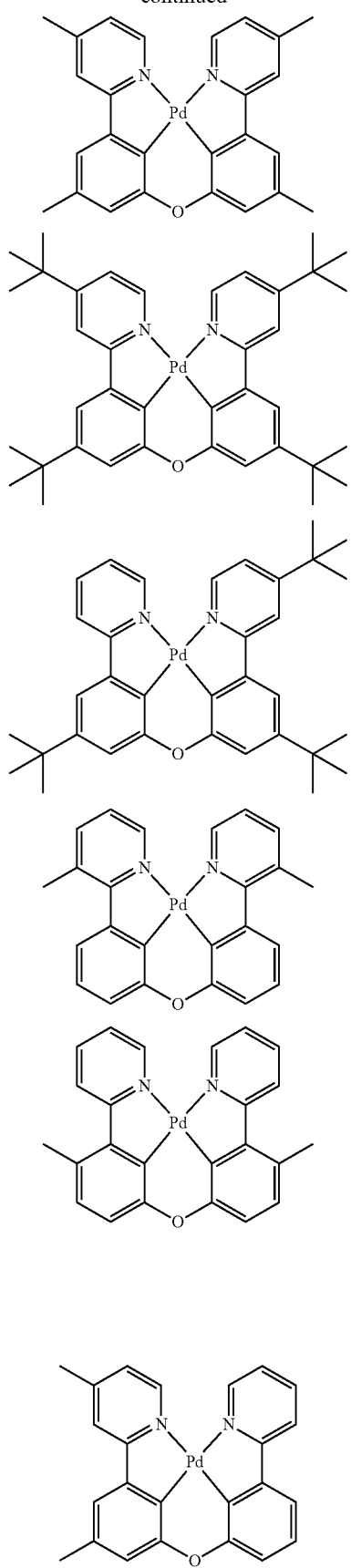
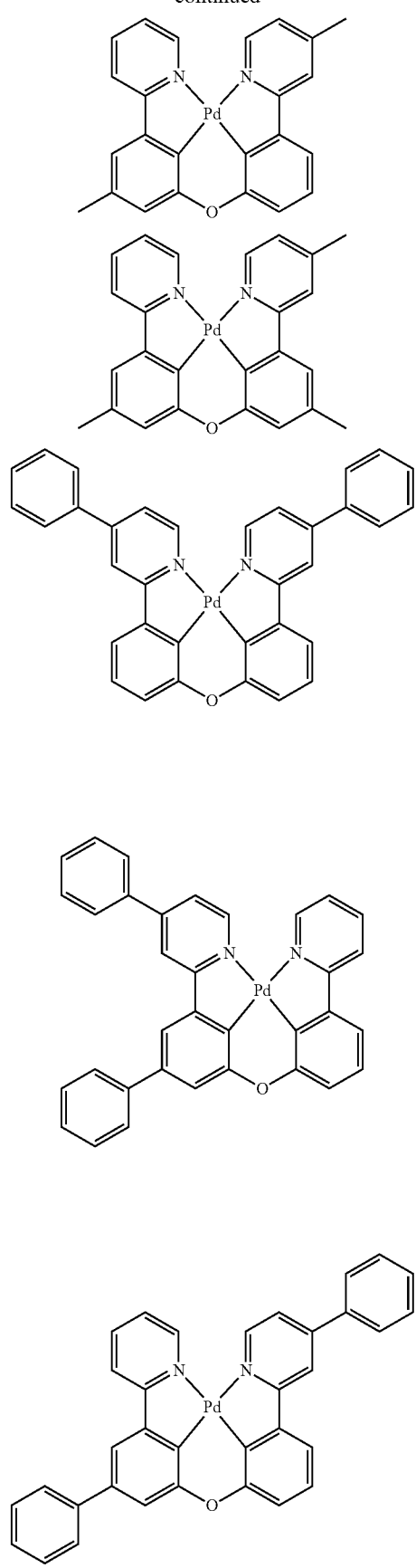

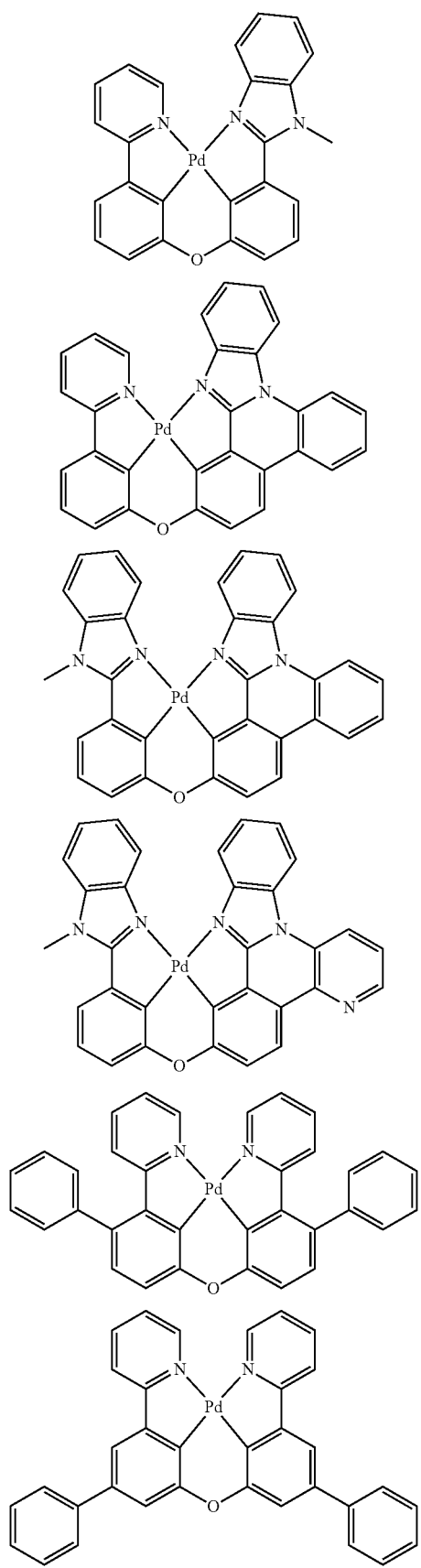
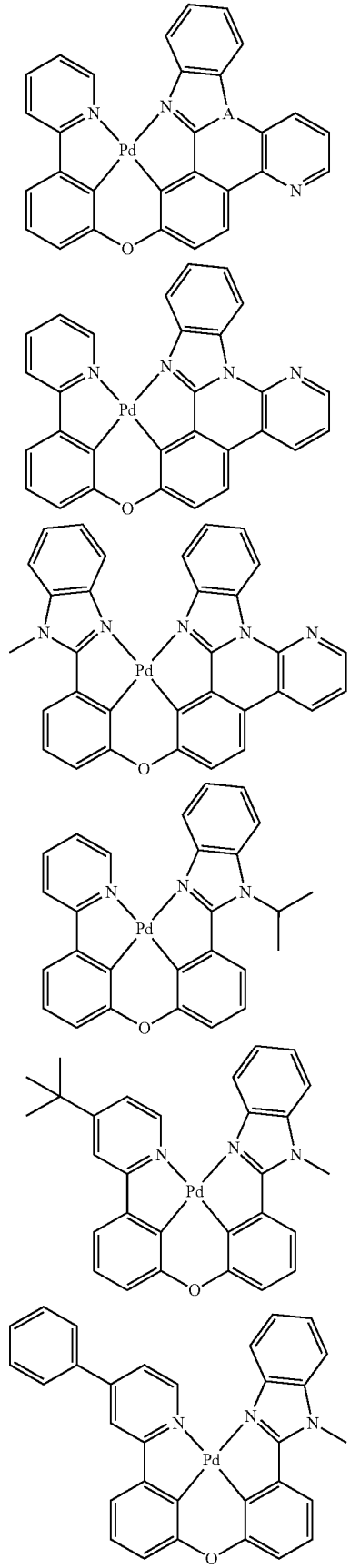

-continued
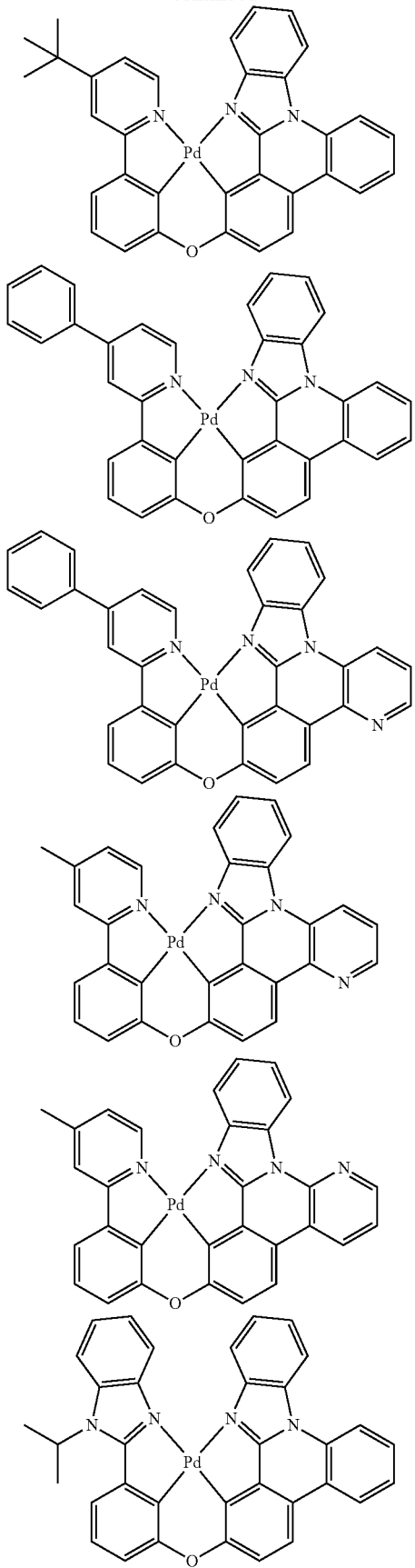
-continued
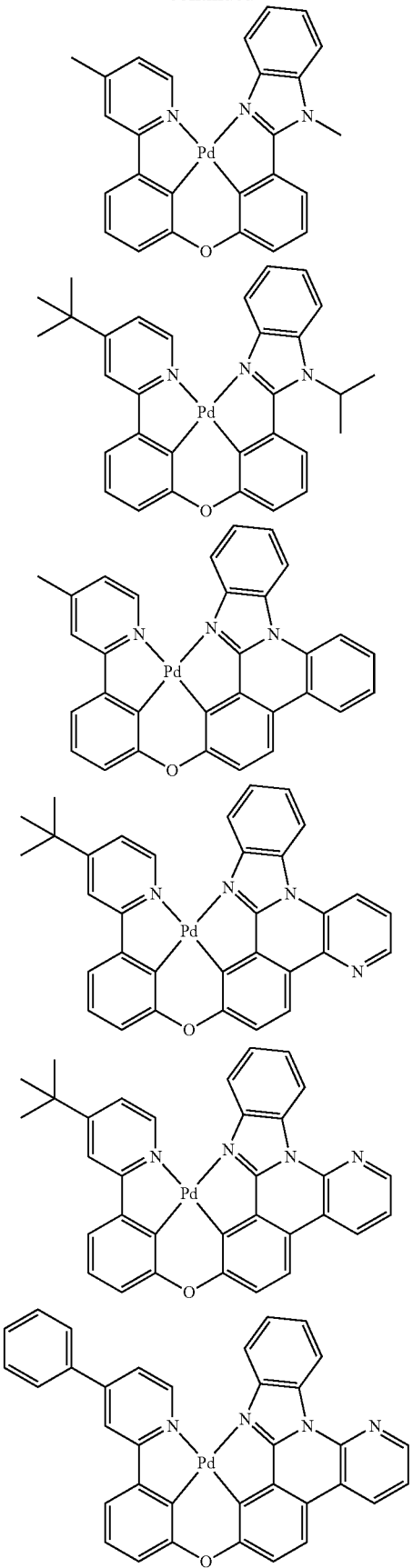

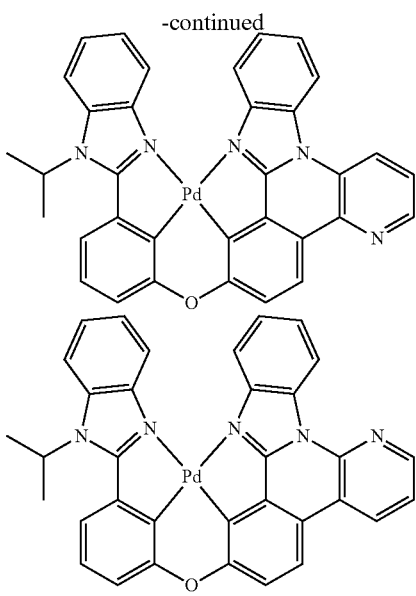

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$R^1$", "$R^2$", "$R^3$", "$R^4$", etc. are used herein as generic symbols to represent various specific substituents. These symbols can be any substituent, not limited to those disclosed herein, and when they are defined to be certain substituents in one instance, they can, in another instance, be defined as some other substituents.

The term "$C_1$-$C_4$ alkyl" as used herein is a branched or unbranched saturated hydrocarbon group of 1 to 4 carbon atoms, such as methyl, ethyl, n-propyl, isopropyl, n-butyl, isobutyl, s-butyl, and t-butyl. The alkyl group can also be substituted or unsubstituted. For example, the alkyl group can be substituted with one or more groups including, but not limited to, alkyl, cycloalkyl, alkoxy, amino, ether, halide, hydroxy, nitro, or thiol.

The terms "alkoxy" and "alkoxyl" as used herein to refer to an alkyl or cycloalkyl group bonded through an ether linkage; that is, an "alkoxy" group can be defined as —$OA^1$ where $A^1$ is alkyl or cycloalkyl.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —N(-alkyl)$_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "halide" as used herein includes fluoride, chloride, bromide, and iodide.

The term "hydroxyl" as used herein is represented by the formula —OH.

The term "azide" as used herein is represented by the formula —$N_3$.

The term "nitro" as used herein is represented by the formula —$NO_2$.

The term "cyanide" as used herein is represented by the formula —CN.

The term "thiol" as used herein is represented by the formula —SH.

"$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group.

The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

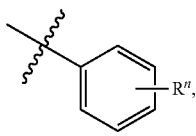

which is understood to be equivalent to a formula:

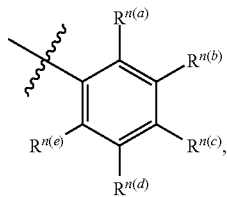

wherein n is typically an integer. That is, R is understood to represent up to five independent non-hydrogen substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of T, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

EXAMPLES

Example 1

A small area OLED (OLED A) having the following structure was prepared: ITO (100 nm)/HATCN (10 nm)/NPD (70 nm)/Tris-PCZ (10 nm)/Pd3O8-P (20 nm)/BAlq (10 nm)/BPyTP (50 nm)/Liq (2 nm)/Al (100 nm), where ITO is indium tin oxide, HATCN is 1,4,5,8,9,12-hexaazatriphenylene-hexacarbonitrile, NPD is N,N'-diphenyl-N,N'-bis(1-naphthyl)-1,1'-biphenyl-4,4'-diamine, Tris-PCz is 9,9',9''-triphenyl-9H,9'H,9''H-3,3':6',3''-tercarbazole, Pd3O8-P is one of selected palladium-based phosphorescent emitters with a full chemical name of palladium (II) 7-(3-(pyridin-2-yl-κN)phenoxy-κC)(benzo[4,5]imidazo-κN)([1,2-f]phenanthridine-κC), BAlq is bis(8-hydroxy-2-methylquinoline)-(4-phenylphenoxy)aluminum, and BPyTP is 2,7-bis(2,2'-bipyridine-5-yl)triphenylene 2,7-di(2,2'-bipyridin-5 yl) triphenylene, Liq is 8-quinolinolato lithium, and Al is aluminum. The device active area was 2 mm×2 mm. The thickness of the charge transport layers (hole-transporting layer, electron-transporting layer, or both) was selected to enhance emission at wavelengths between 570 nm and 610 nm.

Figure 5A:
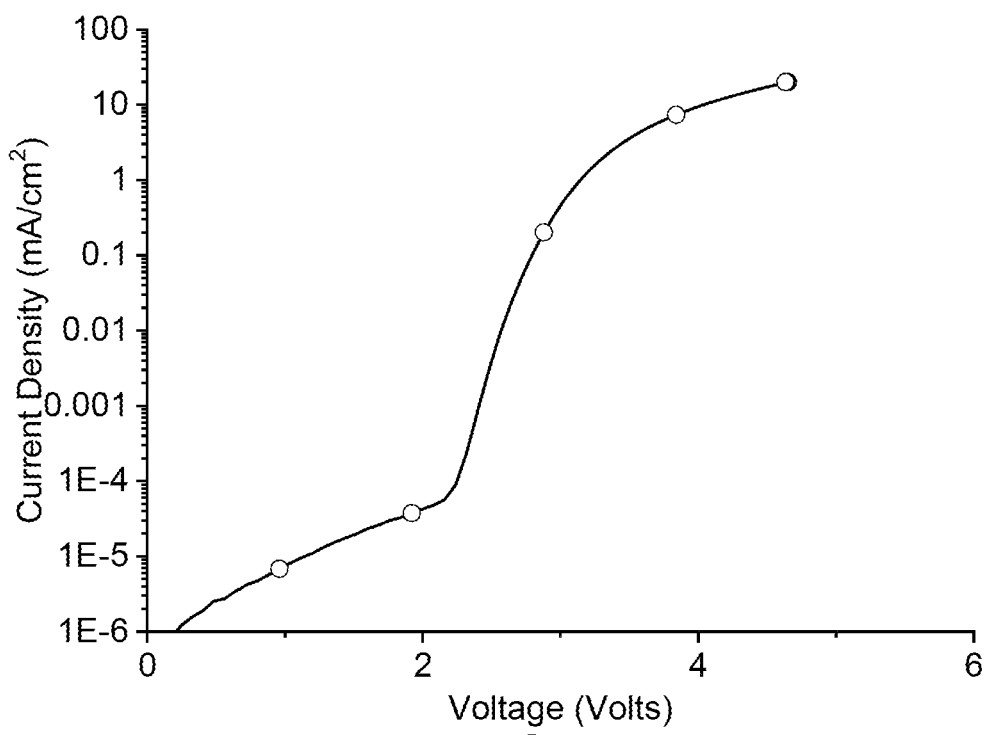
FIGS. 5A-5D show current density versus voltage, electroluminescent (EL) spectra before and after lifetime testing, external quantum efficiency (EQE) versus luminance, and power efficiency versus luminance, respectively, for the OLED of Example 1.
Figure 5B:
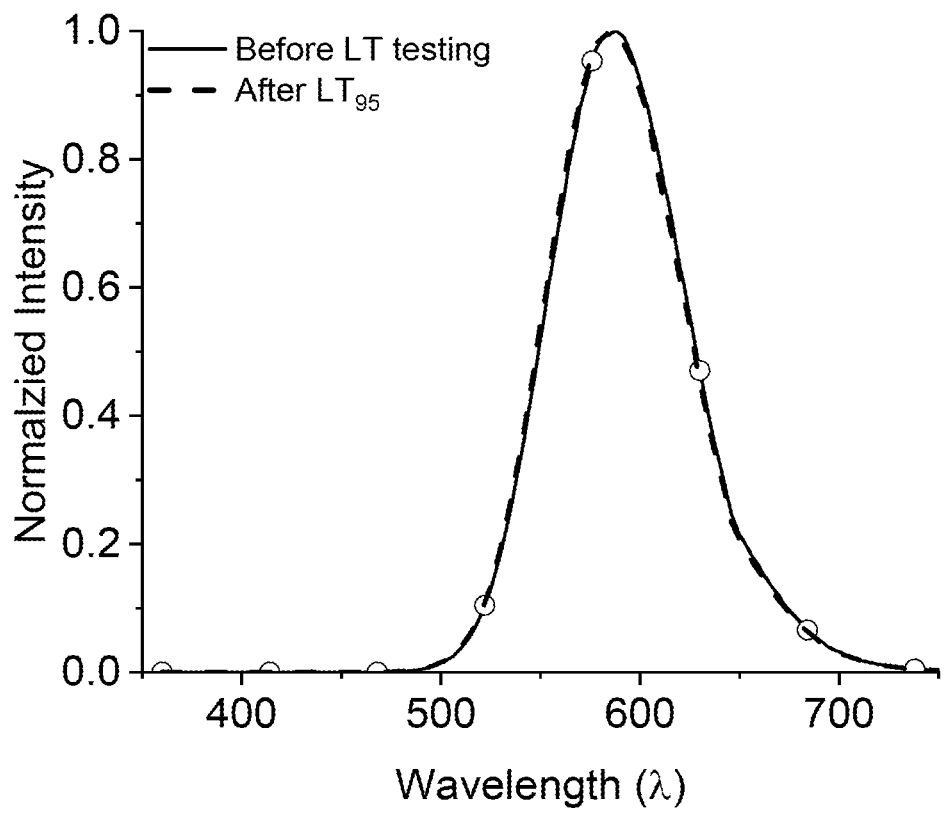
Figure 5C:
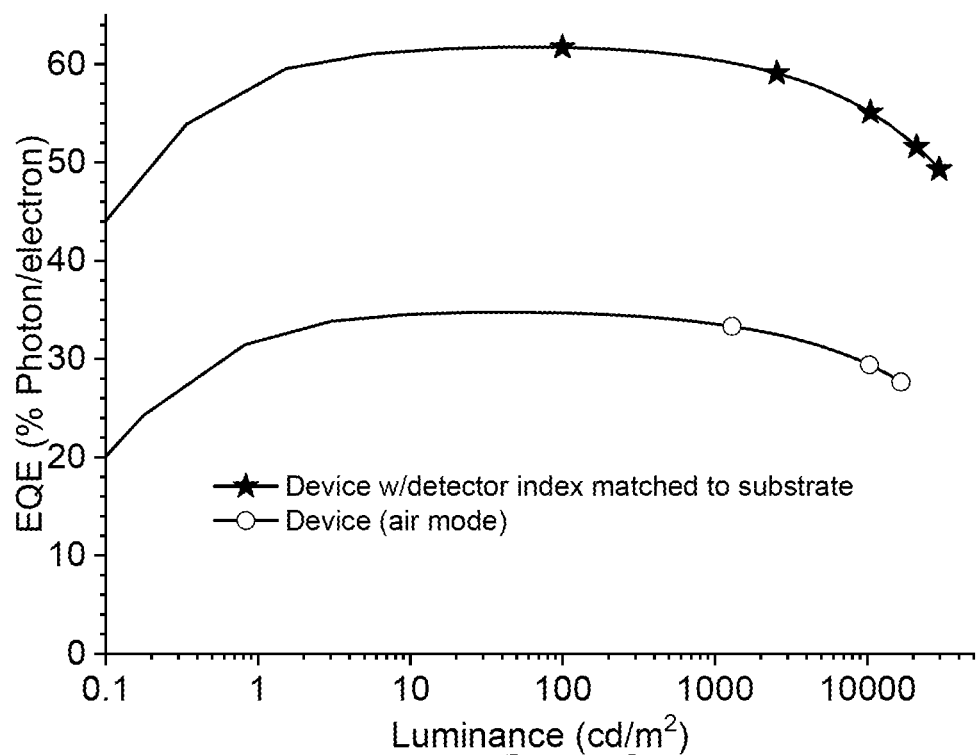
Figure 5D:
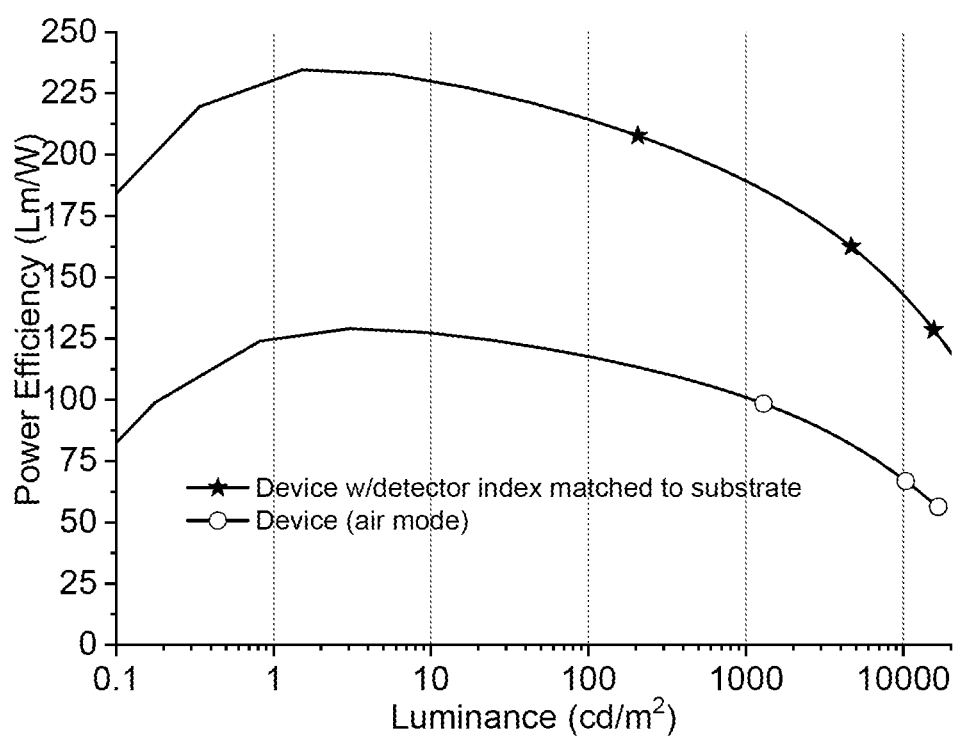

FIG. 5A shows current density versus voltage for OLED A. FIG. 5B shows EL spectra of OLED A before and after lifetime testing. The initial EL spectrum and the EL spectrum after the EL intensity dropped to 95% of the initial value at the constant driving current of 20 mA/cm$^2$ (about 180 hours) are substantially the same, confirming that there is no notable change in the emission color before and after lifetime testing, thus demonstrating excellent color stability. FIG. 5C shows external quantum efficiency (EQE) versus luminance for OLED A. The lower plot (open circles) shows EQE versus luminance for OLED A with air between OLED A and the detector (no outcoupling). OLED A has a peak EQE of 34.8% and a brightness of 16,650 cd m$^{-2}$ at 20 mA cm$^{-2}$, and a remarkably high EQE of close to 30% at the brightness of 10000 cd m$^{-2}$. The upper plot (solid stars) shows EQE versus luminance for OLED A with the insertion of optical index matching glue between the substrate of OLED A and the detector. FIG. 5D shows power efficiency (PE) versus luminance for OLED A. The lower plot (open circles) shows that the low voltage characteristic of the undoped Pd3O8-P emissive layer results in a power efficiency (PE) of 101 Lm W$^{-1}$ at 1,000 cd/m$^{-2}$ and a PE of 67 Lm W$^{-1}$ at 10,000 cd m$^{-2}$ with air between OLED A and the detector. The upper plot (solid stars) demonstrates the potential to further improve the PE with external extraction layers by matching optical indices between the substrate of OLED A and the detector, with the ideal external extraction layer achieving a PE of 188 Lm W$^{-1}$ at 1,000 cd m$^{-2}$ and 142 Lm W$^{-1}$ at 10,000 cd m$^{-2}$. The EQE, low roll-off, and high PE of this amber OLED demonstrates the capability of satisfying strict high brightness performance needs of the lighting industry.

Example 2

Figure 6A:
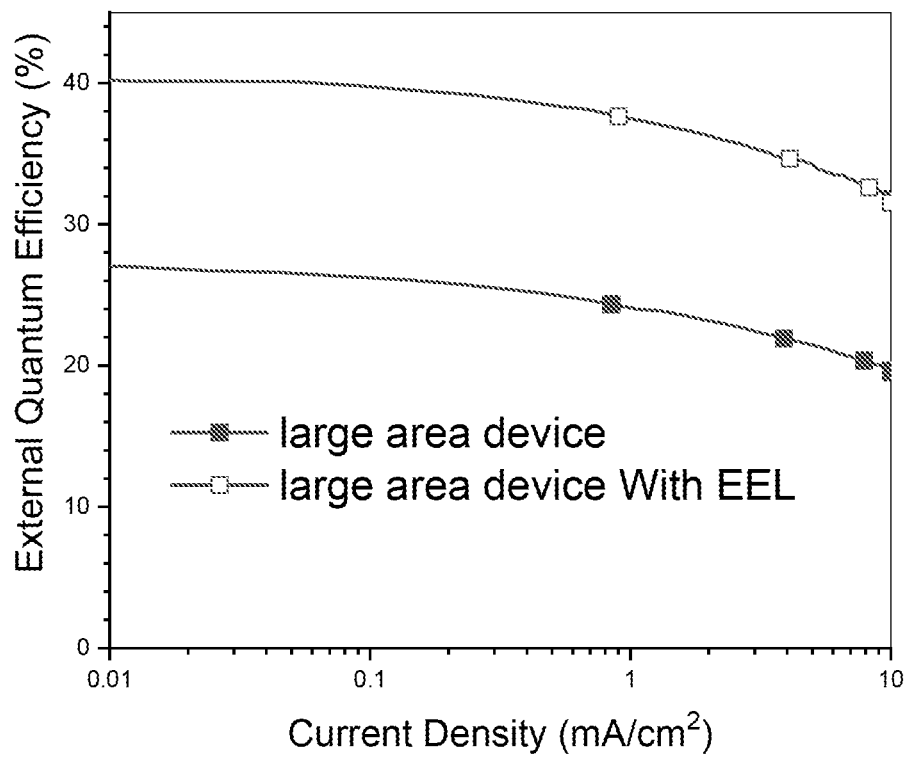
FIGS. 6A-6C show EQE versus current density for the OLED of Example 2 in various configurations.
Figure 6B:
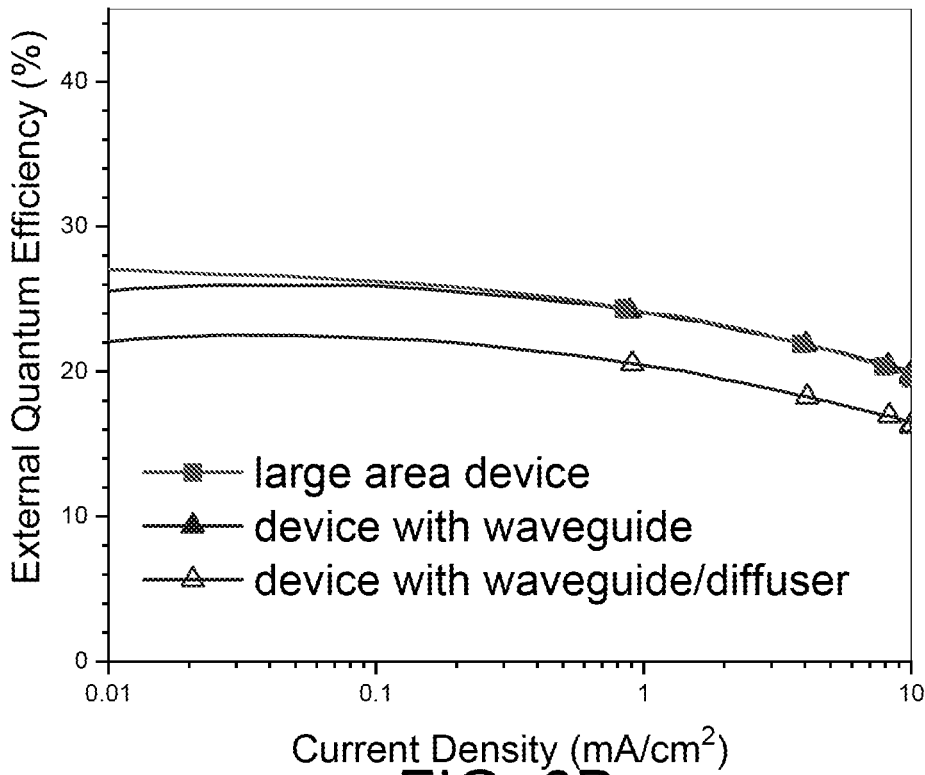
Figure 6C:
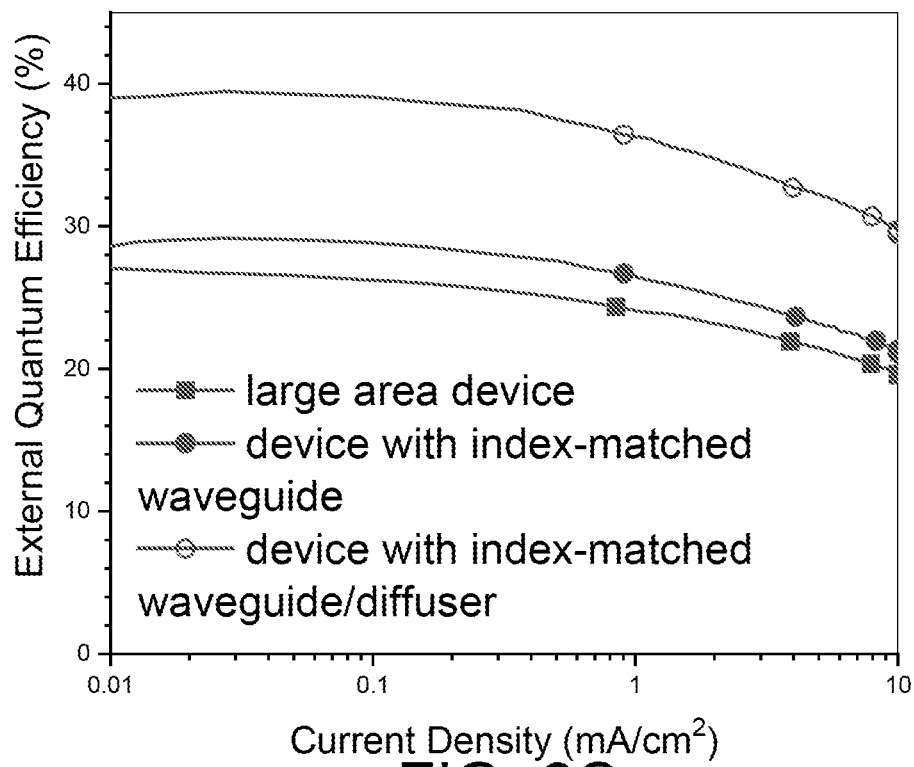

A large area OLED (OLED B) having the following structure was prepared: ITO (100 nm)/HATCN (10 nm)/NPD (70 nm)/Tris-PCZ (10 nm)/Pd3O8-P (20 nm)/BAlq (10 nm)/BPyTP (50 nm)/Liq (2 nm)/Al (100 nm), where the device active area is 20×50 mm. The lower plot (solid squares) in FIG. 6A shows EQE versus current density for OLED B. The upper plot (open squares) in FIG. 6A shows EQE versus current density for OLED B having an external extraction layer. The lower plot is reproduced in FIG. 6B. The upper plot (solid triangles) in FIG. 6B shows EQE versus current density for OLED B optically coupled to a waveguide layer. The lower plot (open triangles) in FIG. 6B shows EQE versus current density for OLED B optically coupled to a waveguide layer and having a diffuser film. Data in FIGS. 6A and 6B correspond to the presence of an air gap between OLED B and the detector. The lower plot (solid squares) in FIG. 6A is reproduced in FIG. 6C. The middle plot (solid circles) in FIG. 6C shows EQE versus current density for OLED B optically coupled to a waveguide layer with the insertion of optical index matching glue between the substrate of OLED B and the waveguide layer. The upper plot (open circles) in FIG. 6C shows EQE versus current density for OLED B optically coupled to a waveguide layer and having a diffuser film with optical index matching glue between the substrate of OLED B and the waveguide layer and between the waveguide layer and the diffuser.

The device efficiency of OLED B (FIG. 6A) is somewhat less than that of OLED A (FIG. 5C), due at least in part to a difference in charge balance inside of the OLEDs, and may be related to the high resistance of ITO layer used in the large area OLED B. As shown in FIG. 6A, device EQE can be improved with the increase of conductivity of anode layer by adding sub nano-grid Ag layer between the ITO and the substrate. An external extraction layer can enhance device EQE by at least about 50%. The device EQE decreased when the waveguide layer or a combination of waveguide layer and diffuser film were simply coupled to the opposite side of the substrate, believed to be due to air gaps between the substrate and the waveguide layer and between the waveguide layer and the diffuser film. However, the insertion of an optical index matching adhesive (e.g., polysilanes or other appropriate transparent viscous polymers) with a refractive index between about 1.4 and about 1.7 typically eliminates such air gaps and enhances the device efficiency, as shown in FIG. 6C. Comparison of FIGS. 6A and 6C reveals that the combination of index-matched waveguide layer and diffuser film can work as effectively as a commercial EEL layer.

Example 3

Figure 7A:
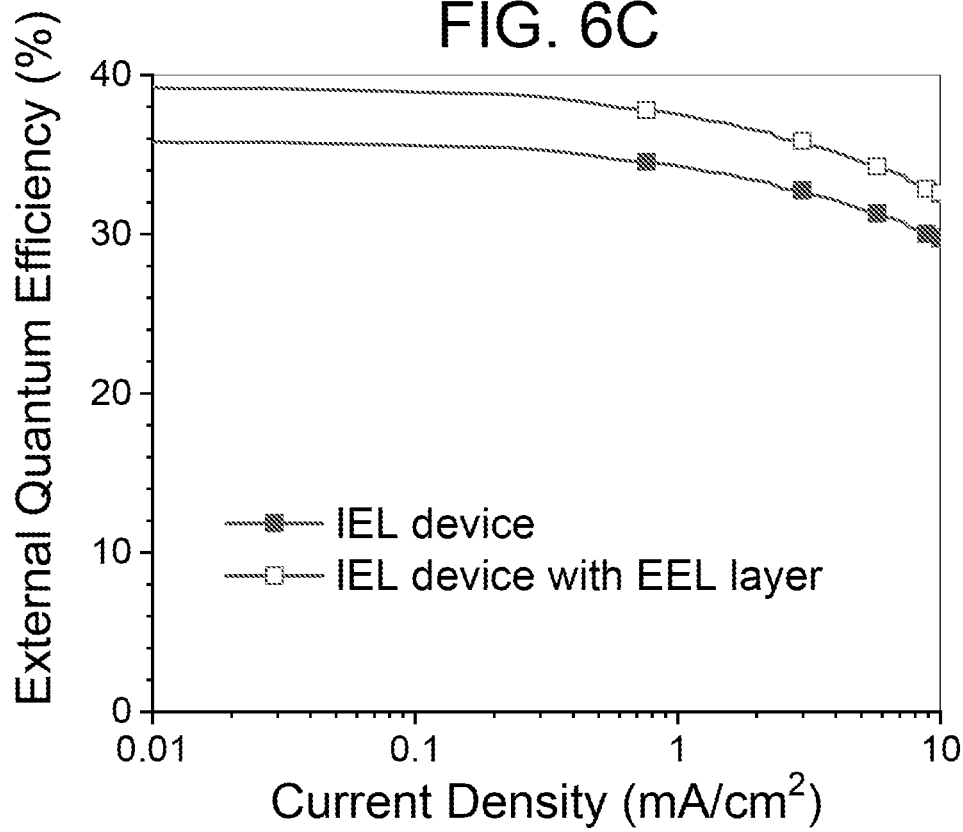
FIGS. 7A-7C show EQE versus current density for the OLED of Example 3 in various configurations.
Figure 7B:
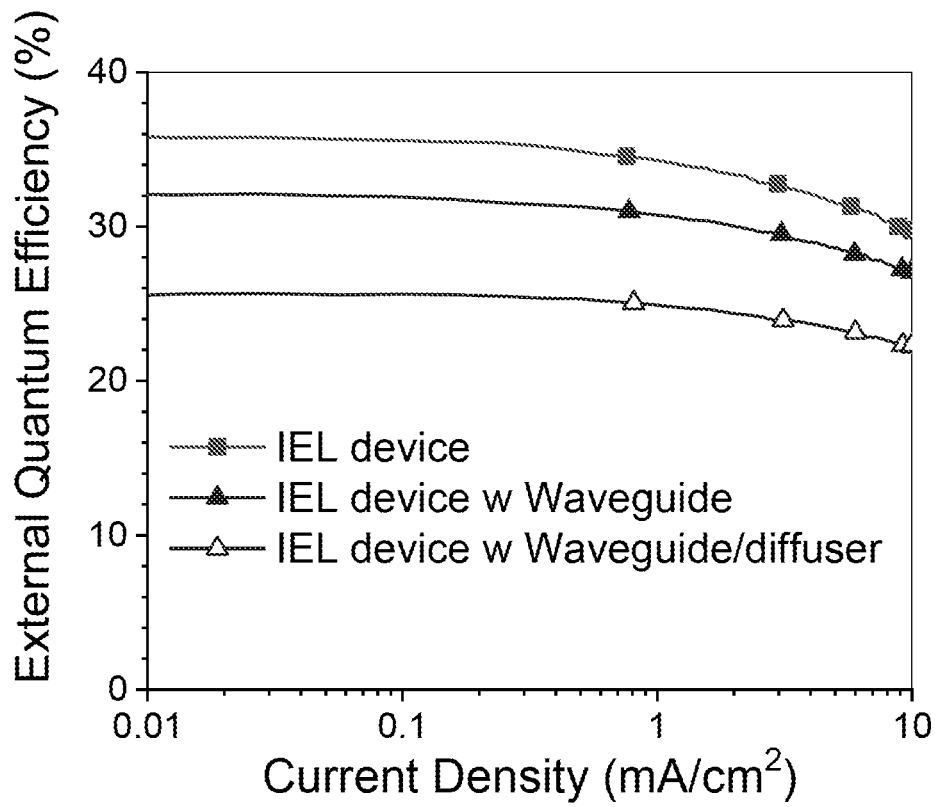
Figure 7C:
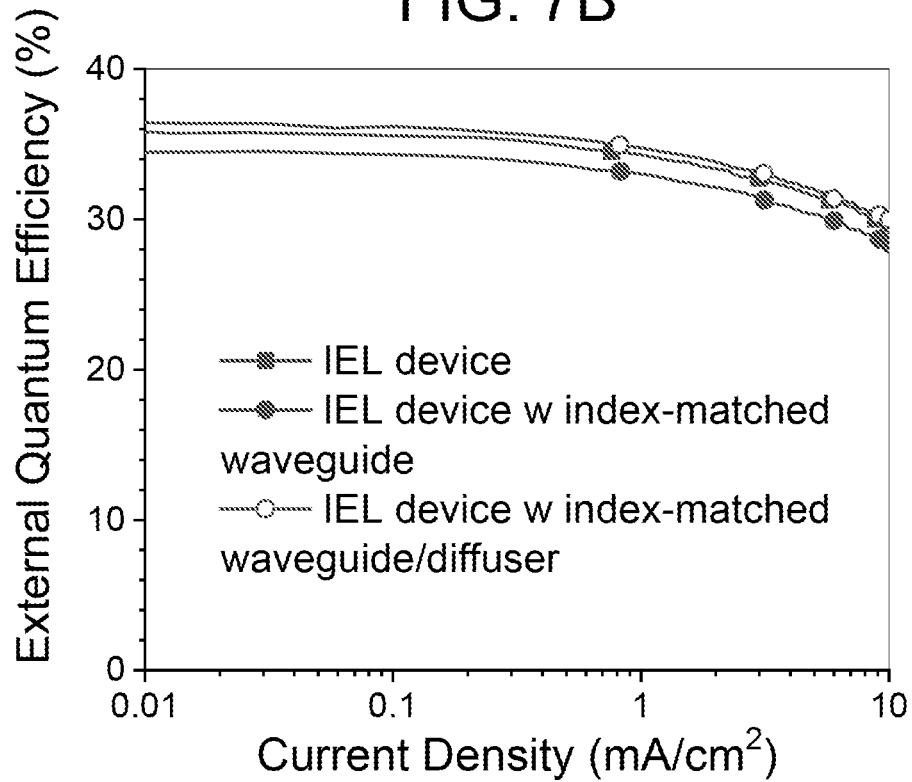

A medium area OLED (OLED C) having the following structure was prepared: ITO (100 nm)/HATCN (10 nm)/NPD (70 nm)/Tris-PCZ (10 nm)/Pd3O8-P (20 nm)/BAlq (10 nm)/BPyTP (50 nm)/Liq (2 nm)/Al (100 nm), where the device active area is 10×20 mm. The lower plot (solid squares) in FIG. 7A shows EQE versus current density for OLED C having an internal extraction layer. The upper plot (open squares) in FIG. 7A shows EQE versus current density for OLED C having an internal extraction layer and an external extraction layer. The lower plot (solid squares) is reproduced in FIG. 7B. The middle plot (solid triangles) in FIG. 7B shows EQE versus current density for OLED C having an internal extraction layer and optically coupled to a waveguide layer. The lower plot (open triangles) in FIG. 7B shows EQE versus current density for OLED C having an internal extraction layer and optically coupled to a waveguide layer and having a diffuser film. Data in FIGS. 7A and 7B correspond to the presence of an air gap between the substrate of OLED C and the detector. The lower plot (solid squares) in FIG. 7A is reproduced in FIG. 7C. The lower plot (solid circles) in FIG. 7C shows EQE versus current density for OLED C optically coupled to a waveguide layer with matching optical glue between the substrate of OLED C and the waveguide layer. The upper plot (open circles) in FIG. 7C shows EQE versus current density for OLED C optically coupled to a waveguide layer and having a diffuser film, with matching optical glue between the substrate of OLED C and the waveguide layer and between the waveguide layer and the diffuser film.

As shown in FIG. 7A, the presence of an internal extraction layer and an external extraction layer enhances device EQE of OLED C by about 10-15% compared to OLED C having only an internal extraction layer. Comparison of FIGS. 7A and 7B shows that device EQE decreased when the waveguide layer or a combination of waveguide layer and diffuser film were simply added coupled to opposite side of substrates, believed to be due to air gaps between the substrate and the waveguide layer and between the waveguide layer and the diffuser film. However, the insertion of an optical index matching adhesive (e.g., polysilanes or other appropriate transparent viscous polymers) with a refractive index between about 1.4 and about 1.7 typically eliminates such air gaps and enhances the device efficiency, as shown in FIG. 7C. Comparison of FIGS. 7A and 7C reveals that combination of index-matched waveguide layer and diffuser film can work almost as effectively as a commercial EEL layer.

Example 4

Figure 8A:
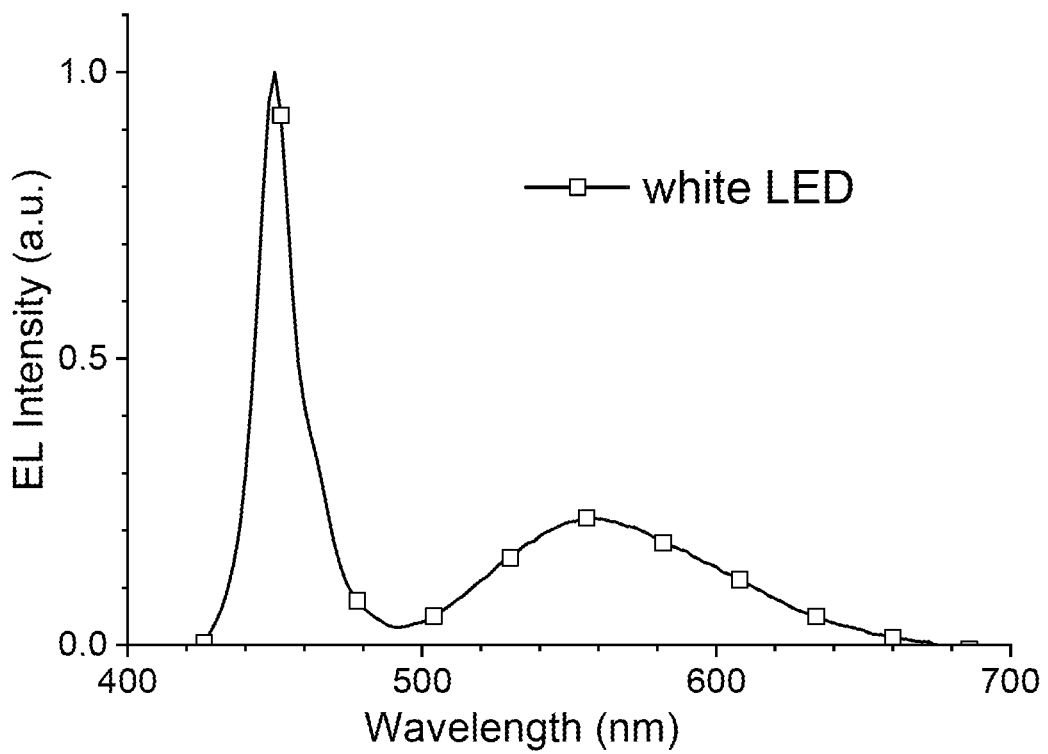
FIGS. 8A-8C show spectra of a white LED, a blue LED, and EL spectra of hybrid LED-OLED devices with various driving current densities for the OLED, respectively, for the OLED of Example 4.
Figure 8B:
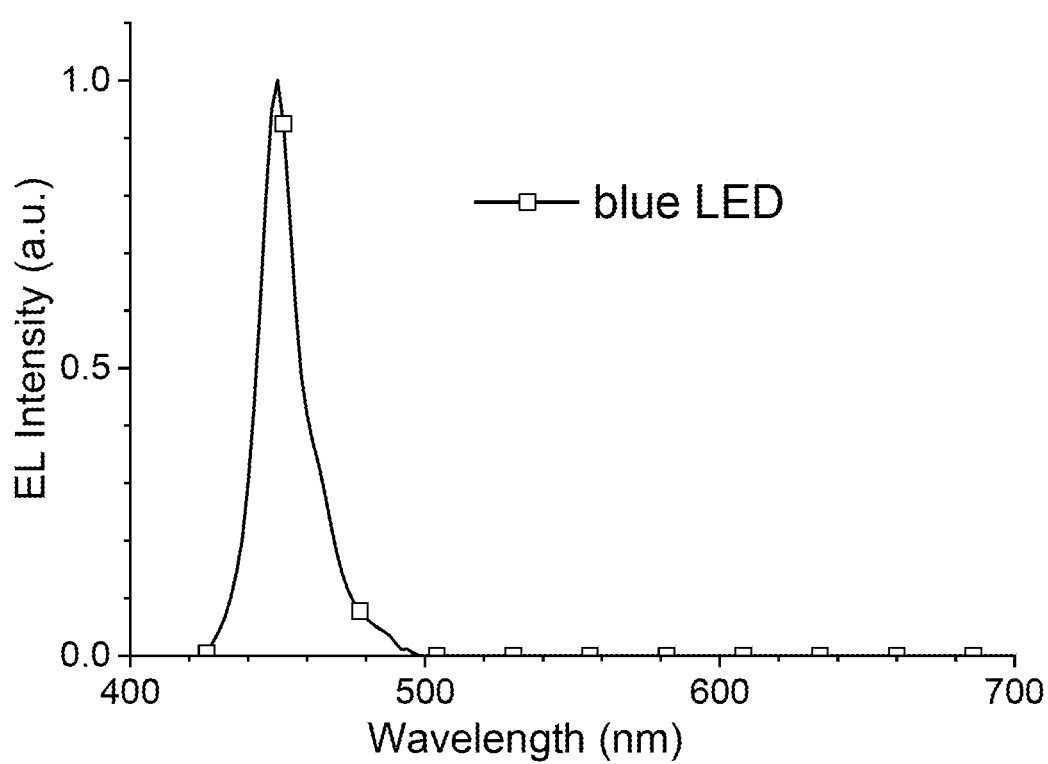
Figure 8C:
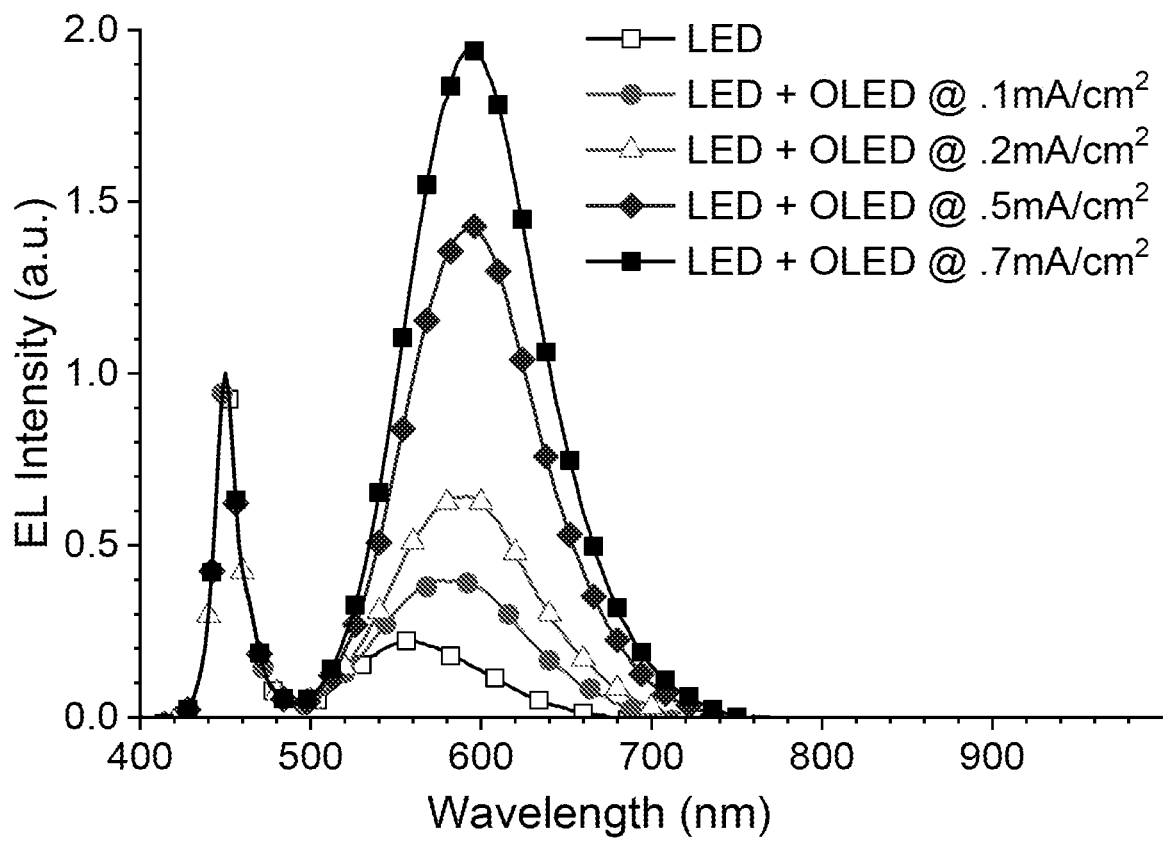

FIGS. 8A and 8B show EL spectra for a white LED and a blue LED, respectively. FIG. 8C shows EL spectra for a white LED (open squares) and for hybrid LED/amber OLED devices. The OLED device (OLED D) was prepared with the following structure: ITO (100 nm)/HATCN (10 nm)/NPD (70 nm)/Tris-PCZ (10 nm)/Pd3O8-P (20 nm)/BAlq (10 nm)/BPyTP (50 nm)/Liq (2 nm)/Al (100 nm), where the device active area is 20×50 mm. The hybrid devices have a waveguide layer and a diffuser film, with optical matching glue between the substrate and the waveguide layer and between the waveguide layer and the diffuser film. The various OLED devices have a driving current density of 0.1 mA/cm$^2$ (solid circles), 0.2 mA/cm$^2$ (open triangles), 0.5 mA/cm$^2$ (solid diamonds), and 0.7 mA/cm$^2$ (solid squares). As shown in FIG. 8C, the device EL spectra can be modified by individually controlling driving current of LED and amber OLED, which can be changed from cool white with exclusive LED emission (open squares) to warm white with dominant amber OLED emission (solid squares).

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A hybrid LED-OLED lighting device comprising:
   a waveguide layer;
   a light-emitting diode (LED) array optically coupled to the waveguide layer; and
   an organic light-emitting diode (OLED) array,
   wherein:
     light emitted from the LED array is provided to an edge of the waveguide layer,
     light emitted from the OLED array is provided to a first surface of the waveguide layer,
     light emitted from the LED array and light emitted from the OLED array passes through a second surface of the waveguide layer opposite the first surface of the waveguide layer, and
     light emitted from the lighting device comprises the light emitted from the LED array and the light emitted from the OLED array,
   wherein the LED array is edge lit or the OLED array is back lit.

2. The lighting device of claim 1, wherein light emitted from the LED array is in the blue range of the visible spectrum.

3. The lighting device of claim 1, wherein the light emitted from the OLED array is in the yellow or amber range of the visible spectrum.

4. The lighting device of claim 1, wherein the light emitted by the lighting device is white light.

5. The lighting device of claim 4, wherein the white light is warm white light or cool white light.

6. The lighting device of claim 1, wherein light emitted by the lighting device is tunable.

7. The lighting device of claim 1, wherein an intensity of the LED array and the OLED array are independently controllable.

8. The lighting device of claim 1, further comprising a reflective layer in direct contact with the first surface of the waveguide layer.

9. The lighting device of claim 1, further comprising a diffuser film in direct contact with the second surface of the waveguide layer.

10. The lighting device of claim 1, further comprising an optical index matching adhesive between the diffuser film and the second surface of the waveguide layer.

11. The lighting device of claim 1, wherein a reflective metallic electrode of the OLED array is positioned between the waveguide layer and a substrate on which the OLED array is fabricated.

12. The lighting device of claim 1, wherein the waveguide layer and a light transmissive electrode of the OLED array are separated by a substrate on which the OLED array is fabricated.

13. The lighting device of claim 1, wherein a LED diffuser structure comprising the waveguide layer further comprises a prism protecting film, a lenz film, a prism film, or any combination thereof.

14. The lighting device of claim 1, wherein an OLED structure comprising the OLED array further comprises an internal extraction layer, an external extraction layer, or both.

15. The lighting device of claim 14, wherein the OLED structure comprises an internal extraction layer, an external extraction layer, and a substrate between the internal extraction layer and the external extraction layer.

16. The lighting device of claim 1, wherein each OLED in the OLED array has a cavity length selected to provide a resonance condition for emission of yellow or amber light.

17. The lighting device of claim 1, wherein the edge of the waveguide layer is approximately perpendicular to the first surface of the waveguide layer.

18. The lighting device of claim 1, wherein the edge of the waveguide layer extends between the first surface and the second surface.

19. The lighting device of claim 1, wherein the OLED array is fabricated on the waveguide layer.

20. The lighting device of claim 1, wherein each OLED in the OLED array comprises an emitter represented by General Formula I:

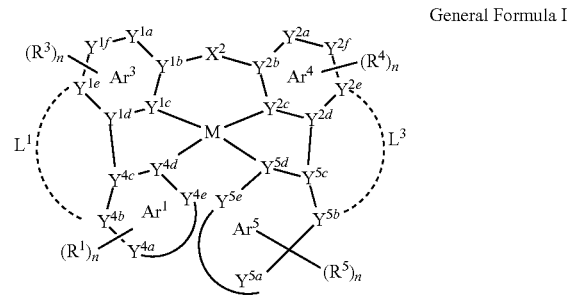

General Formula I wherein:
   M represents Pt(II) or Pd(II);
   $R^1$, $R^3$, $R^4$, and $R^5$ each independently represents hydrogen, halogen, hydroxyl, nitro, cyanide, thiol, or optionally substituted $C_1$-$C_4$ alkyl, alkoxy, amino, or aryl;
   each n is independently an integer, valency permitting;
   $Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, and $Y^{5e}$ each independently represents C, N, Si, O, S;
   $X^2$ represents NR, PR, CRR', SiRR', CRR', SiRR', O, S, S=O, O=S=O, Se, Se=O, or O=Se=O, where R and R' each independently represents hydrogen, halogen, hydroxyl, nitro, cyanide, thiol, or optionally substituted $C_1$-$C_4$ alkyl, alkoxy, amino, aryl, or heteroaryl;
   each of $L^1$ and $L^3$ is independently present or absent, and if present, represents a substituted or unsubstituted linking atom or group, where a substituted linking atom is bonded to an alkyl, alkoxy, alkenyl, alkynyl, hydroxy, amine, amide, thiol, aryl, heteroaryl, cycloalkyl, or heterocyclyl moiety;
   $Ar^3$ and $Ar^4$ each independently represents a 6-membered aryl group; and
   $Ar^1$ and $Ar^5$ each independently represents a 5- to 10-membered aryl, heteroaryl, fused aryl, or fused heteroaryl.

21. The lighting device of claim 1, wherein each OLED in the OLED array comprises an emitter represented by General Formulas II-IX:

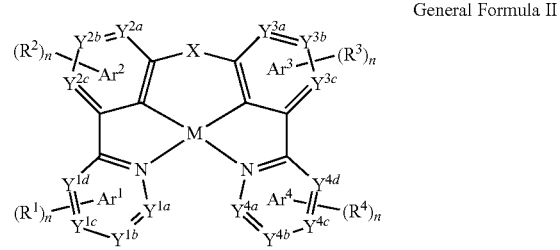

General Formula II

General Formula III

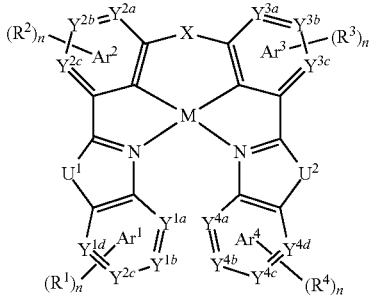

General Formula IV

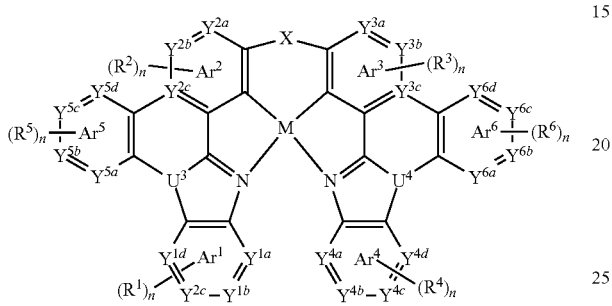

General Formula V

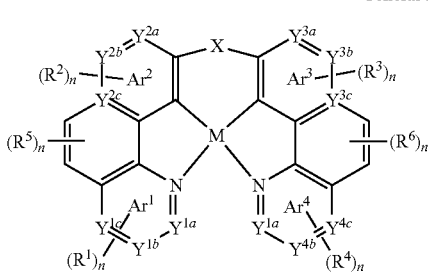

General Formula VI

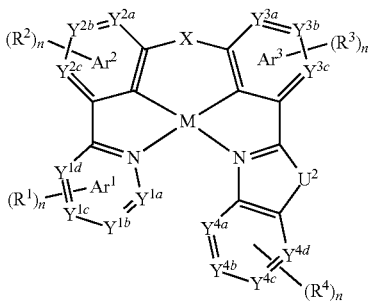

General Formula VII

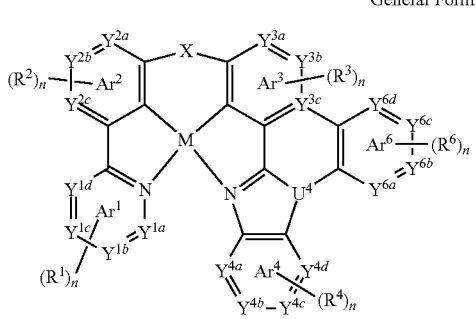

General Formula VIII

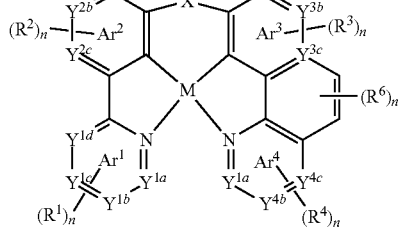

General Formula IX

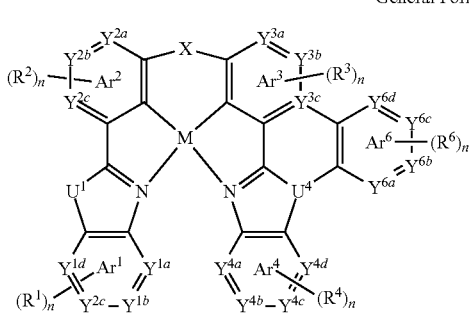

wherein:

M represents Pt(II) or Pd(II);

$R^1$, $R^2$, $R^3$, $R^4$, $R^5$, and $R^6$ each independently represents hydrogen, halogen, hydroxyl, nitro, nitrile, thiol, or optionally substituted $C_1$-$C_4$ alkyl, alkoxy, amino, or aryl;

each n is independently an integer, valency permitting;

$Y^{1a}$, $Y^{1b}$, $Y^{1c}$, $Y^{1d}$, $Y^{2a}$, $Y^{2b}$, $Y^{2c}$, $Y^{3a}$, $Y^{3b}$, $Y^{3c}$, $Y^{4a}$, $Y^{4b}$, $Y^{4c}$, $Y^{5a}$, $Y^{5b}$, $Y^{5c}$, $Y^{5d}$, $Y^{6a}$, $Y^{6b}$, $Y^{6c}$, and $Y^{6d}$ each independently represents C, N, or Si;

$U^1$ and $U^2$ each independently represents NR, O or S, wherein R represents hydrogen, halogen, hydroxyl, nitro, nitrile, thiol, or optionally substituted $C_1$-$C_4$ alkyl, alkoxy, amino, or aryl;

$U^3$ and $U^4$ each independently represents N or P; and

X represents O, S, NR, CRR', SiRR', PR, BR, S=O, O=S=O, Se, Se=O, or O=Se=O, where R and R' each independently represents hydrogen, halogen, hydroxyl, nitro, nitrile, thiol, or optionally substituted $C_1$-$C_4$ alkyl, alkoxy, amino, aryl, or heteroaryl.

22. The lighting device of claim 1, further comprising an optical index matching adhesive between the waveguide layer and a substrate on which the OLED array is fabricated.

23. The lighting device of claim 10, further comprising an additional optical index matching adhesive between the waveguide layer and a substrate on which the OLED array is fabricated.

* * * * *